(12) United States Patent
Petersen

(10) Patent No.: US 11,990,831 B2
(45) Date of Patent: May 21, 2024

(54) HYBRID BUCK BOOST CONVERTER WITH REDUCED INDUCTOR CURRENT

(71) Applicant: Dialog Semiconductor (UK) Limited, London (GB)

(72) Inventor: Holger Petersen, Pastetten (DE)

(73) Assignee: Renesas Design (UK) Limited, Bourne End (GB)

( * ) Notice: Subject to any disclaimer, the term of this patent is extended or adjusted under 35 U.S.C. 154(b) by 0 days.

(21) Appl. No.: 17/875,797

(22) Filed: Jul. 28, 2022

(65) Prior Publication Data

US 2023/0045186 A1    Feb. 9, 2023

Related U.S. Application Data

(63) Continuation-in-part of application No. 17/396,591, filed on Aug. 6, 2021, now abandoned.

(51) Int. Cl.
*H02M 3/07* (2006.01)
*H02M 1/00* (2006.01)

(52) U.S. Cl.
CPC ........... *H02M 1/0095* (2021.05); *H02M 3/07* (2013.01)

(58) Field of Classification Search
CPC ....................... H02M 3/07–078; H02M 1/0095
See application file for complete search history.

(56) References Cited

U.S. PATENT DOCUMENTS

| | | | |
|---|---|---|---|
| 6,963,497 B1 | 11/2005 | Herbert | |
| 7,230,405 B2 | 6/2007 | Jang et al. | |
| 7,782,027 B2 | 8/2010 | Williams | |
| 8,427,113 B2 | 4/2013 | Xing et al. | |
| 9,559,589 B2 | 1/2017 | Petersen | |
| 9,768,682 B2 | 9/2017 | Banag | |
| 10,218,255 B1 | 2/2019 | Petersen | |
| 10,256,729 B1 | 4/2019 | Notsch | |
| 10,291,117 B2 | 5/2019 | Petersen | |
| 10,298,124 B2 | 5/2019 | Petersen et al. | |
| 10,476,390 B2 | 11/2019 | Petersen | |
| 10,756,623 B1 | 8/2020 | Petersen | |
| 10,790,742 B1 | 9/2020 | Petersen | |
| 10,811,974 B1 | 10/2020 | Petersen | |
| 11,228,243 B2 | 1/2022 | Petersen | |

(Continued)

OTHER PUBLICATIONS

U.S. Office Action, U.S. Appl. No. 17/396,591, Applicant: Holger Petersen, Mail date: Nov. 17, 2022, 25 pages.

(Continued)

*Primary Examiner* — Peter M Novak
(74) *Attorney, Agent, or Firm* — Saile Ackerman LLC; Stephen B. Ackerman

(57) ABSTRACT

A buck-boost power converter is operable in a first mode (step-down) or in a second mode (step-up). The power converter has an inductor, a flying capacitor, a network of six switches and a driver adapted to drive the network of switches with a sequence of states. Depending on the mode of operation the sequence of states comprises at least one of a first state and a second state. In the first state the ground port is coupled to the second port via two paths, a first path comprising the flying capacitor and the inductor, and a second path comprising the flying capacitor while bypassing the inductor. In the second state the first port is coupled to the second port via a path that includes the inductor and the ground port is coupled to the first port via a path that includes the flying capacitor while bypassing the inductor.

27 Claims, 20 Drawing Sheets

(56) References Cited

U.S. PATENT DOCUMENTS

| | | | |
|---|---|---|---|
| 11,456,663 | B2 | 9/2022 | Petersen |
| 11,709,515 | B1 | 7/2023 | Asano et al. |
| 2008/0079393 | A1 | 4/2008 | Spartano et al. |
| 2008/0157732 | A1 | 7/2008 | Williams |
| 2008/0158915 | A1 | 7/2008 | Williams |
| 2009/0033289 | A1 | 2/2009 | Xing et al. |
| 2009/0174466 | A1 | 7/2009 | Hsieh et al. |
| 2010/0188065 | A1 | 7/2010 | Shiwaya |
| 2011/0062940 | A1 | 3/2011 | Shavartsman |
| 2013/0147543 | A1 | 6/2013 | Dai et al. |
| 2014/0070787 | A1 | 3/2014 | Arno |
| 2015/0061613 | A1 | 3/2015 | Kondou |
| 2015/0280553 | A1 | 10/2015 | Giuliano et al. |
| 2015/0311793 | A1 | 10/2015 | Khayat et al. |
| 2016/0344214 | A1 | 11/2016 | Petersen et al. |
| 2017/0163157 | A1 | 6/2017 | Petersen |
| 2017/0244318 | A1 | 8/2017 | Giuliano |
| 2017/5244318 | | 8/2017 | Giuliano |
| 2017/0302093 | A1 | 10/2017 | Petersen |
| 2019/0341850 | A1 | 11/2019 | Macri |
| 2022/0181967 | A1 | 6/2022 | Petersen |
| 2022/0181973 | A1 | 6/2022 | Huang |
| 2022/0190724 | A1 | 6/2022 | Petersen |
| 2022/0311339 | A1 | 9/2022 | Yen |

OTHER PUBLICATIONS

Co-pending U.S. Pat. No. DS21-018G, "Inverting Buck-Boost Converter," Holger Petersen, U.S. Appl. No. 17/396,594, filed Aug. 6, 2021, 30 pages.

"Right-Half-Plane Zero Elimination of Boost Converter Using Magnetic Coupling With Forward Energy Transfer," by Behzad Poorali et al., IEEE Transactions on Industrial Electronics, vol. 66, No. 11, Nov. 2019 pp. 8454-8462.

"Fully Integrated Buck Converter with 78% Efficiency at 365mW Output Power Enabled by Switched-Inductor-Capacitor Topology and Inductor Current Reduction Technique," by Nghia Tang et al., ISSCC 2019, Session 8, DC-DC Converters 8.4, 2019 IEEE International Solid-State Circuits Conference, Feb. 17-21, 2019.

"A New Approach to Low Ripple-Noise Switching Converters on the Basis of Switched-Capacitor Converters," by Tohru Umeno et al., 1991., IEEE International Symposium on Circuits and Systems, Jun. 11-14, 1991, 4 pages.

"Three-Level Buck Converter for Envelope Tracking Applications," by Vahid Yousefzadeh et al., IEEE Transactions on Power Electronics, vol. 21, No. 2, Mar. 2006, pp. 549-552.

"Split-Phase Control: Achieving Complete Soft-Charging Operation of a Dickson Switched-Capacitor Converter," by Yutian Lei et al., IEEE Transactions on Power Electronics, vol. 31, No. 01, Jan. 2016, pp. 770-782.

"A Simple Hybrid 3-Level Buck-Boost DC-DC Converter with Efficient PWM Regulation Scheme," by Abdullah Abdulslam et al., 2015 IEEE International Conference on Electronics, Circuits, and Systems (ICECS), Dec. 6-9, 2015, pp. 368-371.

"A Hybrid DC-DC Converter Capable of Supplying Heavy Load in Step-Up and Step-Down Mode," by Jinwoo Jeon et al., 2021 IEEE International Symposium on Circuits and Systems (ISCAS), May 22-28, 2021, 5 pages.

Co-pending U.S. Pat. No. DS21-012G, "Buck-Boost Converter," Holger Petersen, U.S. Appl. No. 17/396,591, filed Aug. 6, 2021, 39 pages.

"A Hybrid Dual-Path Step-Down Converter with 96.2% Peak Efficiency using a 250mΩ Large-DCR Inductor," by Yeunhee Huh et al., 2018 IEEE Symposium on VLSI Circuits Digest of Technical Papers, Jun. 18-22, 2018, pp. 225-226.

"A Hybrid Structure Dual-Path Step-Down Converter With 96.2% Peak Efficiency Using 250-mΩ Large-DCR Inductor," by Yeunhee Huh et al., IEEE Journal of Solid-State Circuits, vol. 54, No. 4, Apr. 2019, pp. 959-967.

"High-Efficiency Hybrid Dual-Path Step-Up DC-DC Converter With Continuous Output-Current Delivery for Low Output Voltage Ripple," by Se-Un Shin et al., IEEE Transactions on Power Electronics, vol. 35,No. 6, Jun. 2020, pp. 6025-6038.

Motorola Semiconductor Application Note: "A Unique Converter Configuration," Provides Step-Up/Down Functions, AN954, Copyright: Motorola Inc., 1985, 4 pages.

ISSCC 2017, Session 10, DC-DC Converters, 10.4, "A Hybrid Inductor-Based Flying-Capacitor-Assisted Step-Up/Step-Down DC-DC Converter with 96.56% Efficiency," by Yong-Min Ju et al., 2017 IEEE International Solid-State Circuits Conference (ISSCC), Feb. 5-9, 2017, 3 pages.

"A Fully-Integrated 3-Level DC-DC Converter for Nanosecond-Scale DVFS," by Wonyoung Kim et al., IEEE Journal of Solid-State Circuits, vol. 47, No. 1, Jan. 2012, pp. 206-219.

"Multi-Level Conversion: High Voltage Choppers and Voltage-Source Inverters," by T.A. Meynard et al., PESC '92 Record. 23rd Annual IEEE Power Electronics Specialists Conference, Jun. 29-Jul. 3, 1992, pp. 397-403.

"A Hybrid Switched-Capacitor/Inductor Converter for Small Conversion Ratios," by Norah Elena Nakibuuka, Thesis: M. Eng., MIT, Department of Electrical Engineering and Computer Science, 2013, Copyright: Massachusetts Institute of Technology, May 2013, 69 pages.

"Analysis of Double Step-Down Two-Phase Buck Converter for VRM," by K. Nishijima et al., Intelec 05—Twenty-Seventh International Telecommunications Conference, Sep. 18-22, 2005, pp. 497-502.

"Multi-Phase Buck Converters with Extended Duty Cycle," by Yungtaek Jang et al., Twenty-First Annual IEEE Applied Power Electronics Conference and Exposition, 2006. APEC '06, Mar. 19-23, 2006, pp. 38-44.

"Zero Inductor Voltage Multilevel Bus Converter," by Samuel Webb et al. 2018 IEEE Applied Power Electronics Conference and Exposition (APEC), Mar. 4-8, 2018, pp. 2175-2182.

U.S. Notice of Allowance, U.S. Appl. No. 17/396,594, Applicant: Holger Petersen, Mail date: Nov. 1, 2023, 33 pages.

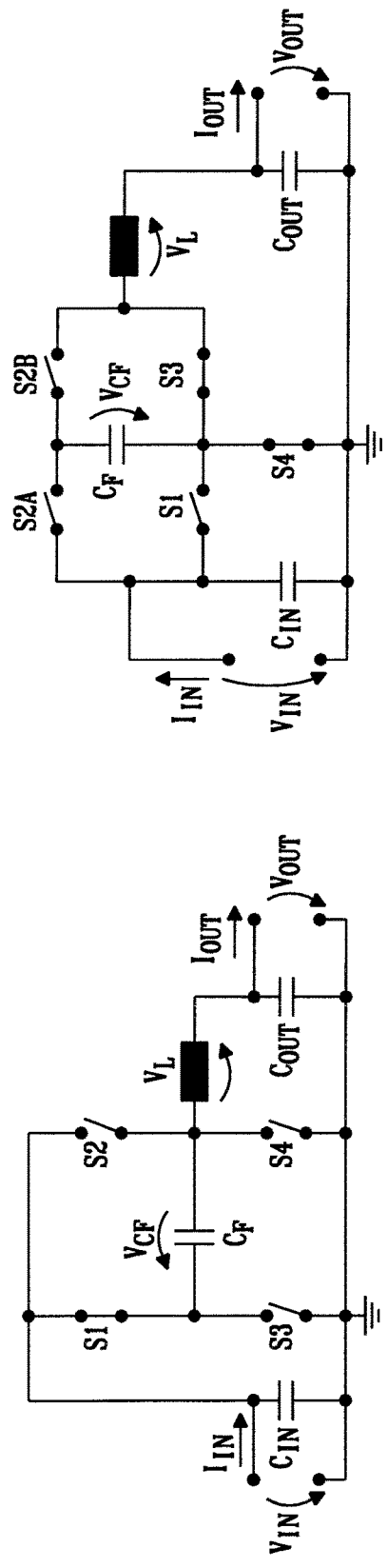
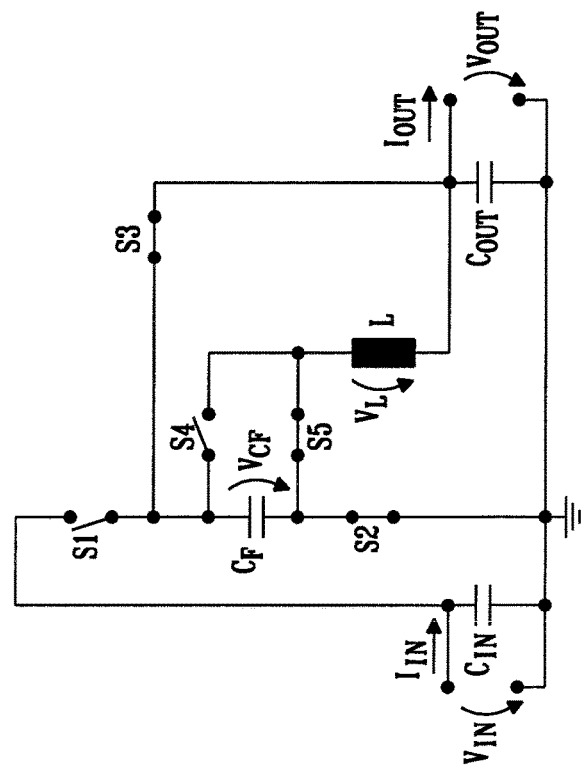
FIG. 1A Prior Art
FIG. 1B Prior Art
FIG. 1C Prior Art

210

Providing a power converter operable in a first mode as a step-down converter or in a second mode as a step-up converter, the power converter comprising a ground port, a first port and a second port, an inductor having a first terminal connected to the second port; a flying capacitor coupled to a network of switches comprising a first switch to couple a first terminal of the flying capacitor to the first port;
a second switch to couple a second terminal of the flying capacitor to the first port;
a third switch to couple the first terminal of the flying capacitor to the second terminal of the inductor;
a fourth switch to couple the second terminal of the flying capacitor to the second terminal of the inductor;
a fifth switch to couple the second terminal of the flying capacitor to the ground port;
a sixth switch to couple the first terminal of the flying capacitor to the second port; and

220

Driving the network of switches with a sequence of states during a drive period, wherein depending on the mode of operation the sequence of states comprises at least one of a first state and a second state, wherein in the first state the ground port is coupled to the second port via a first path and a second path, the first path comprising the flying capacitor and the inductor, and a second path comprising the flying capacitor while bypassing the inductor; wherein in the second state the first port is coupled to the second port via a path that includes the inductor, and wherein the ground port is coupled to the first port via a path that includes the flying capacitor while bypassing the inductor.

FIG. 2

HYBRID BUCK BOOST CONVERTER WITH REDUCED INDUCTOR CURRENT

This application is a Continuation-In-Part application (DS21-012G_CIP) of application Ser. No. 17/396,591, filed on Aug. 6, 2021, owned by a common assignee, and which is herein incorporated by reference in its entirety.

RELATED PATENT APPLICATION

This application is related to DS21-018G, U.S. application Ser. No. 17/396,594, filed on Aug. 6, 2021, which is assigned to a common assignee, and which is herein incorporated by reference in its entirety.

FIELD OF THE DISCLOSURE

The present disclosure relates to a buck-boost converter and in particular to a hybrid non-inverting buck-boost converter. In particular the present disclosure relates to a buck boost converter with reduced inductor current.

BACKGROUND

Buck-boost converters can be used for various applications. For instance, the recent integration of laser diodes such as Vertical-Cavity Surface-Emitting Lasers (VCSEL), into smartphones and mobile computing has increased the demand for buck-boost converters with improved performance. These semiconductor lasers can be used to implement face recognition technology on smartphone to identify a 3D shape of a programmed face by laser projection. In turn the identity of a user can be confirmed to unlock the device. The power supply voltage levels for VCSEL are typically lower than the nominal voltage of a Li-Ion battery pack. At the end of a battery discharge cycle the battery voltage may have dropped by more than 40%. In this condition the supply rail of the VCSEL needs to be higher than the output voltage of the battery pack. The generation of such a power rail requires DC-DC buck-boost conversion. Traditional pure inductive buck-boost converters suffer from large solution footprint/height (typically dominated by inductors), see for instance Motorola semiconductor application note, "A Unique Converter Configuration Provides Step-up/Down Functions", 1985.

The 3-Level Buck-Boost described in publication titled "A Simple Hybrid 3-Level Buck-Boost DC-DC Converter with Efficient PWM Regulation Scheme", IEEE, 2015 by Abdulslam enables continuous output current within a limited step-up conversion range. This continuous output current reduces inductor peak current and with that inductor conduction loss and footprint. The theoretical maximum step-up ratio is $V_{OUT}/V_{IN}<2:1$, however at the (high) load current of a laser diode and with non-ideal components, the maximum step-up ratio is typically $V_{OUT}/V_{IN}<1.7:1$.

In addition, smartphones and tablet computers are progressively adopting organic light-emitting diode (OLED) display technology. OLED displays provide superior viewing angles, contrast, and more brilliant color reproduction in comparison to LED panels using backlighting. OLED panels require brightness setting dependent supply voltages higher or lower than the output voltage of a Li-Ion battery pack. Since OLED panels are sensitive to power supply noise the buck-boost converters must fulfill tight voltage accuracy specifications. As the converters operate whenever the display is active their power dissipation has a significant impact to the battery lifetime of a mobile application. Traditional pure inductive buck-boost converters suffer from average conversion efficiency and high ripple current/voltage. The limited maximum voltage step-up ratio of the 3 level buck boost converter described by Abdulslam is typically not sufficient for the power supply of OLED panels.

SUMMARY

There is therefore a need for a power converter with improved boost conversion efficiency and reduced output voltage ripple that supports an extended maximum voltage boost ratio.

According to a first aspect of the disclosure, there is provided a power converter for providing an output voltage with a target conversion ratio, the power converter being operable in a first mode as a step-down converter or in a second mode as a step-up converter, the power converter comprising a ground port, a first port and a second port;
  an inductor having a first terminal connected to the second port;
  a flying capacitor coupled to a network of switches comprising
  a first switch (S2A) to couple a first terminal of the flying capacitor to the first port;
  a second switch (S1) to couple a second terminal of the flying capacitor to the first port;
  a third switch (S2B) to couple the first terminal of the flying capacitor to the second terminal of the inductor;
  a fourth switch (S3) to couple the second terminal of the flying capacitor to the second terminal of the inductor;
  a fifth switch (S4) to couple the second terminal of the flying capacitor to the ground port;
  a sixth switch (S5) to couple the first terminal of the flying capacitor to the second port; and
  a driver adapted to drive the network of switches with a sequence of states during a drive period, wherein depending on the mode of operation the sequence of states comprises at least one of a first state (D1 or D1') and a second state (B1 or B1'); wherein in the first state (D1 or D1') the ground port is coupled to the second port via a first path and a second path, the first path comprising the flying capacitor and the inductor, and the second path comprising the flying capacitor while bypassing the inductor; wherein in the second state (B1 or B1') the first port is coupled to the second port via a path that includes the inductor and wherein the ground port is coupled to the first port (B1' or B1) via a path that includes the flying capacitor while bypassing the inductor.

For instance the inductor may be a single inductor. The flying capacitor may be implemented as single or multiple capacitors connected in series and/or in parallel. Alternatively a capacitor network may be used. Such a capacitor network may change configuration during the operation of the converter.

Optionally, wherein in the first state (D1 or D1') the voltage across the inductor is null.

Optionally, wherein the sequence of states further comprises a third state (D2 or D2').

Optionally, wherein in the third state (D2 or D2') the first port is coupled to the second port via a path that includes the first switch (S2A), the flying capacitor, the fourth switch (S3) and the inductor.

Optionally, wherein the sequence of states further comprises a fourth state (DV/DP') or (B2/B2').

Optionally, wherein in the fourth state (DV or DP') the ground port is coupled to the second port via a first path and a second path, the first path comprising the inductor and a second path comprising the flying capacitor while bypassing the inductor.

Optionally, wherein in the fourth state (B2 or B2') the first port is coupled to the second port via a path that includes the second switch (S1), the flying capacitor, the third switch (S2B) and the inductor.

Optionally, wherein for a conversion ratio of output voltage over input voltage less than one the voltage across the flying capacitor is driven substantially equal to the output voltage, and wherein for a conversion ratio of output voltage over input voltage greater than one the voltage across the flying capacitor is driven substantially equal to the input voltage.

For instance, for a conversion ratio of output voltage over input voltage less than one the voltage across the flying capacitor may be achieved using a switching sequence that includes the first state (D1) and optionally the fourth state (DV) when the first port is the input port and the second port is the output port, and using a switching sequence that includes the second state (B1') when the first port is the output port and the second port is the input port. For a conversion ratio of output voltage over input voltage greater than one the voltage across the flying capacitor may be achieved using a switching sequence that includes the second state (B1) when the first port is the input port and the second port the output port, and using a switching sequence that includes the first state (D1') and optionally the fourth state (DP') when the first port is the output port and the second port is the input port.

For a conversion ratio of output voltage over input voltage between 0.5 and 1, the voltage across the flying capacitor may be achieved using a switching sequence that includes the first state (D1) and optionally a magnetization state (DP) when the first port is the input port and the second port is the output port. In the magnetization state (DP) the first port is coupled to the second port via a path that includes the first switch (S2A), the third switch (S2B) and the inductor.

Optionally, wherein the first port is an input port for receiving an input voltage and the second port is an output port for providing an output voltage.

Optionally, wherein the conversion ratio of output voltage over input voltage is less than two.

Optionally, wherein the inductor has an average inductor current and an inductor current ripple, and wherein both reach a minimum value for a conversion ratio of the output voltage over the input voltage of about one half.

Optionally, wherein the first port is an input port for receiving an input voltage and the second port is an output port for providing an output voltage, wherein the fourth state is a de-magnetization state and wherein the conversion ratio of the output voltage over the input voltage is less than one half.

Optionally, wherein the first port is an input port for receiving an input voltage and the second port is an output port for providing an output voltage, and wherein the power converter operates as a step-down converter. For instance the conversion ratio of the output voltage over the input voltage may be between one half and one.

Optionally, wherein when the power converter operates as a step-up converter, the sequence of states comprises the second state (B1), and when the power converter operates as a step-down converter, the sequence of states comprises the first state (D1).

Optionally, wherein in the second state (B1) the first port is coupled to the second port via a path that includes the first switch (S2A), the third switch (S2B) and the inductor, and wherein the ground port is coupled to the second port via a path that includes the fifth switch (S4), the flying capacitor, the third switch (S2B) and the inductor.

Optionally, wherein the second port is an input port for receiving an input voltage and the first port is an output port for providing an output voltage.

Optionally, wherein the conversion ratio of output voltage over input voltage is greater than one half.

Optionally, wherein the inductor has an inductor current ripple, and wherein the inductor current ripple reaches a minimum value for a conversion ratio of the output voltage over the input voltage of about one, and/or for a conversion ratio of the output voltage over the input voltage of about two.

Optionally, wherein the second port is an input port for receiving an input voltage and the first port is an output port for providing an output voltage, wherein the fourth state is a magnetization state, and wherein the conversion ratio of the output voltage over the input voltage is greater than two.

Optionally, wherein the second port is an input port for receiving an input voltage and the first port is an output port for providing an output voltage, and wherein the conversion ratio of the output voltage over the input voltage is between one and two.

Optionally, wherein a voltage across the flying capacitor remains between the input voltage and the output voltage during the drive period.

Optionally, wherein when the power converter operates as a step-down converter, the sequence of states comprises the second state (B1') and when the power converter operates as a step-up converter the sequence of states comprises the first state (D1').

Optionally, wherein in the second state (B1') the first port is coupled to the second port via a path that includes the first switch (S2A), the third switch (S2B) and the inductor, and wherein the ground port is coupled to the first port via a path that includes the fifth switch (S4), the flying capacitor, the first switch (S2A).

Optionally, wherein when the power converter operates with a conversion ratio of output voltage over input voltage equal to one, the sequence of states comprises both the first state (D1 or D1') and the second state (B1 or B1').

Optionally, wherein when the power converter operates with a conversion ratio of output voltage over input voltage equal to one, the sequence of states comprises the second state (B1) or the magnetization state (DP).

Optionally, the first port is the input port and the second port the output port, and the power converter operates with a conversion ratio of the output voltage over the input voltage between zero and one-half and wherein the sequence of states comprises the first state (D1), the third state (D2) and a de-magnetization state (DV); wherein in the de-magnetization state (DV) the ground port is coupled to the second port via a first path and a second path, the first path comprising the fifth switch (S4), the third switch (S3), the inductor and a second path comprising the fifth switch (S4), the flying capacitor, the sixth switch (S5) while bypassing the inductor.

For instance, the sequence may include two instances of the de-magnetization state (DV) per drive period. For example the sequence may be D1/DV/D2/DV.

Optionally, the first port is the input port and the second port the output port, and the power converter operates with a conversion ratio of the output voltage over the input voltage between one-half and one and wherein the sequence of states comprises the first state (D1), the third state (D2), and a magnetization state (DP); wherein in the magnetization state (DP) the first port is coupled to the second port via a path that includes the first switch (S2A), the third switch (S2B) and the inductor.

For instance, the sequence may include two instances of DP per drive period. For example, the sequence may be D1/DP/D2/DP.

Optionally, wherein the first port is the input port and the second port the output port, and the power converter operates with a conversion ratio of the output voltage over the input voltage greater than one, wherein the sequence of states comprises the second state (B1) and a fourth state (B2), wherein in the fourth state (B2) the first port is coupled to the second port via a path that includes the second switch (S1), the flying capacitor, the third switch (S2B) and the inductor.

For instance, the sequence may include two instances of B1 and two instances of B2 per drive period. For instance the sequence may be B1/B2/B1/B2.

Optionally, wherein the first port is the output port and the second port the input port, and the power converter operates with a conversion ratio of the output voltage over the input voltage between 4/7 and 1, and wherein the sequence of states comprises the second state (B1') and the fourth state (B2'), wherein in the fourth state (B2') the first port is coupled to the second port via a path that includes the second switch (S1), the flying capacitor, the third switch (S2B) and the inductor.

For instance, the sequence may include two instances of B1' and two instances of B2' per drive period. For instance the sequence may be B1'/B2'/B1'/B2'.

Optionally, wherein the first port is the output port and the second port the input port, and the power converter operates with a conversion ratio of the output voltage over the input voltage between one and two, and wherein the sequence of states comprises the first state (D1'), the third state (D2') and a de-magnetization state (DV'); wherein in the de-magnetization state (DV') the first port is coupled to the second port via a path that includes the inductor, the third switch (S2B) and the first switch (S2A).

For instance, the sequence may include two instances of (DV') per drive period. For example the sequence may be D1'/DV'/D2'/DV'.

Optionally, wherein the first port is the output port and the second port the input port, and the power converter operates with a conversion ratio of the output voltage over the input voltage greater than two, and wherein the sequence of states comprises the first state (D1'), the third state (D2') and a magnetization state (DP'); wherein in the magnetization state (DP') the ground port is coupled to the second port via a first path and a second path, the first path comprising the fifth switch (S4), the fourth switch (S3) and the inductor, and a second path comprising the fifth switch (S4), the flying capacitor and the sixth switch (S5) while bypassing the inductor.

For instance, the sequence may include two instances of DP' per drive period. For example the sequence may be D1'/DP'/D2'/DP'.

According to a second aspect of the disclosure, there is provided a method of converting power with a target conversion ratio, the method comprising
providing a power converter operable in a first mode as a step-down converter or in a second mode as a step-up converter, the power converter comprising a ground port, a first port and a second port, an inductor having a first terminal connected to the second port; a flying capacitor coupled to a network of switches comprising a first switch (S2A) to couple a first terminal of the flying capacitor to the first port; a second switch (S1) to couple a second terminal of the flying capacitor to the first port; a third switch (S2B) to couple the first terminal of the flying capacitor to the second terminal of the inductor; a fourth switch (S3) to couple the second terminal of the flying capacitor to the second terminal of the inductor; a fifth switch (S4) to couple the second terminal of the flying capacitor to the ground port;
a sixth switch (S5) to couple the first terminal of the flying capacitor to the second port; and
driving the network of switches with a sequence of states during a drive period, wherein depending on the mode of operation the sequence of states comprises at least one of a first state (D1or D1') and a second state (B1 or B1'), wherein in the first state (D1 or D1') the ground port is coupled to the second port via a first path and a second path, the first path comprising the flying capacitor and the inductor, and the second path comprising the flying capacitor while bypassing the inductor; wherein in the second state (B1 or B1') the first port is coupled to the second port via a path that includes the inductor, and wherein the ground port is coupled to the first port via a path that includes the flying capacitor while bypassing the inductor.

The options described with respect to the first aspect of the disclosure are also common to the second aspect of the disclosure.

According to a third aspect of the disclosure there is provided a user device comprising a display and a first power converter according to the first aspect for powering the display.

Optionally, the user device further comprising a semiconductor laser and a second power converter according to the first aspect for powering the semiconductor laser.

The user device according to the third aspect of the disclosure may comprise any of the features described above in relation to the power converter according to the first aspect of the disclosure.

BRIEF DESCRIPTION OF THE DRAWINGS

The disclosure is described in further detail below by way of example and with reference to the accompanying drawings, in which:

FIG. 1A is a diagram of a buck-boost converter according to the prior art;

FIG. 1B is a diagram of another buck-boost according to the prior art;

FIG. 1C is a diagram of a hybrid buck converter according to the prior art;

FIG. 2 is a flow chart of a method for converting power with a target conversion ratio according to the disclosure;

DETAILED DESCRIPTION

Figure 3:
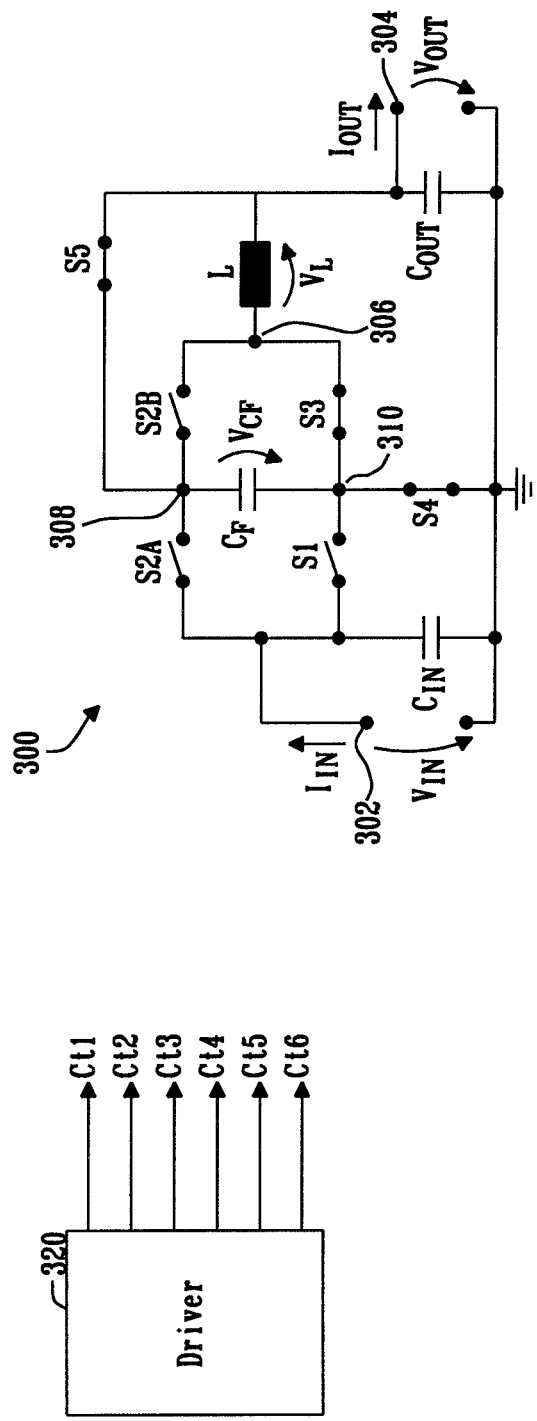
FIG. 3 is a diagram of a power converter for implementing the method of FIG. 2.

FIG. 1A shows the topology of a buck-boost converter according to the publication titled "A Simple Hybrid 3-Level Buck-Boost DC-DC Converter with Efficient PWM Regulation Scheme", IEEE, 2015 by Abdulslam.

This circuit topology implements a theoretical maximum voltage step-up ratio $V_{OUT}/V_{IN}<2$. For combined step-up and step-down conversion the switches S2 and S3 require a back-to-back isolation which may need an anti-serial arrangement of two field effect transistors FETs each containing a parasitic body diode. In addition, the FETs S1 and S4 require a voltage rating about twice the maximum input voltage $V_{IN}$, which increases conduction losses and reduce efficiency. For a combined step-up and step-down conversion, the voltage $V_{CF}$ across the flying capacitor $C_F$ is typically forced towards $V_{CF}=V_{IN}$.

FIG. 1B illustrates a buck-boost converter according to U.S. Ser. No. 10/476,390B2. This circuit topology also implements a theoretical maximum voltage step-up ratio $V_{OUT}/V_{IN}<2$ but removes the need for switches with back-to-back isolation. It also enables the FETs S1 and S4 with a voltage rating approximately equal to the maximum input voltage $V_{IN}$. This results in a smaller die area and improved converter efficiency. The voltage $V_{CF}$ across the flying capacitor $C_F$ is typically driven towards $V_{CF}=V_{IN}$.

FIG. 1C shows a diagram of a hybrid buck converter according to US U.S. Ser. No. 10/298,124B2. The buck converter implements a reduced inductor current via a capacitive current path that bypasses the inductor (current path through switch S3). The voltage $V_{CF}$ across the above flying capacitor is forced to $V_{CF}=V_{OUT}$, but the above architecture cannot provide an output voltages $V_{OUT}$ greater than the input voltage $V_{IN}$.

FIG. 2 is a flow chart of a method for converting power with a target conversion ratio according to the disclosure.

At step 210 a power converter operable in a first mode as a step-down converter or in a second mode as a step-up converter, is provided. The power converter comprises three ports: a ground port, a first port and a second port. It also includes an inductor having a first terminal connected to the second port and a flying capacitor coupled to a network of switches. The network of switches comprises a first switch to couple a first terminal of the flying capacitor to the first port; a second switch to couple a second terminal of the flying capacitor to the first port; a third switch to couple the first terminal of the flying capacitor to the second terminal of the inductor; a fourth switch to couple the second terminal of the flying capacitor to the second terminal of the inductor; a fifth switch to couple the second terminal of the flying capacitor to the ground port; a sixth switch to couple the first terminal of the flying capacitor to the second port.

At step 220 the network of switches is driven with a sequence of states during a drive period. Depending on the mode of operation the sequence of states comprises at least one of a first state and a second state. In the first state the ground port is coupled to the second port via a first path and a second path, the first path comprising the flying capacitor and the inductor, and a second path comprising the flying capacitor while bypassing the inductor. In the second state the first port is coupled to the second port via a path that includes the inductor, and wherein the ground port is coupled to the first port via a path that includes the flying capacitor while bypassing the inductor.

For a conversion ratio of output voltage over input voltage less than one the voltage across the flying capacitor may be driven substantially equal to the output voltage, and for a conversion ratio of output voltage over input voltage greater than one the voltage across the flying capacitor may be driven substantially equal to the input voltage.

FIG. 3 shows a diagram of a buck-boost power converter for implementing the method of FIG. 2. The power converter 300 has a ground port, a first port 302 and a second port 304. In this example the first port 302 is an input port for receiving an input voltage and the second port 304 is an output port for providing an output voltage. The power converter 300 includes a single inductor L, a single flying capacitor $C_F$ and a network of switches formed of six switches S1, S2A, S2B, S3, S4, S5. The inductor L has a first terminal connected to the second port 304 and a second terminal connected to S3 and S2B at node 306. The flying capacitor $C_F$ has a first terminal at node 308 and a second terminal at node 310. The flying capacitor first terminal is coupled to the first port 302 via the switch S2A, to the inductor second terminal (node 306) via switch S2B and to the second port 304 via the switch S5. The flying capacitor second terminal is coupled to the first port 302 via the switch S1, to the inductor second terminal via switch S3 and to ground via the switch S4.

An input capacitor Cin is provided between the first port 302 and ground and an output capacitor Cout is provided between the second port 304 and ground. The capacitors Cin and Cout are connected to a fixed ground voltage and may be referred to as reservoir capacitors. The capacitor $C_F$ has terminals provided with varying voltages and is referred to as a flying capacitor. The flying capacitor may be implemented as single or multiple capacitors connected in series and/or in parallel. Alternatively a capacitor network may be used. Such a capacitor network may change configuration during the operation of the converter.

A driver 320 is provided to generate a plurality of control signals Ct1, Ct2, Ct3, Ct4, Ct5, Ct6 to operate the switches S1, S2A, S2B, S3, S4 and S5 respectively. The driver 320 is adapted to operate the converter 300 with a sequence of states during a drive period T.

Depending on the mode of operation being selected (first mode for step-down conversion or second mode for a step-up conversion) the sequence of states comprises a first state (D1) or a second state (B1).

In the first state (D1) the ground port is coupled to the second port via a first path and a second path, the first path comprising the flying capacitor and the inductor, and a second path comprising the flying capacitor while bypassing the inductor.

In the second state (B1) the first port is coupled to the second port via a path that includes the inductor and bypasses the flying capacitor, and the ground port is coupled to the second port via a path that includes the flying capacitor.

When the power converter operates as a step-down converter (first mode), the sequence of states comprises the first state (D1). When the power converter operates as a step-up converter (second mode), the sequence of states comprises the second state (B1).

In comparison to the prior art topology of FIG. 1A, the switches of the buck-boost converter of FIG. 3 have a reduced voltage rating (voltage rating equal to the maximum input voltage $V_{IN}$). This improves the converter efficiency.

There is also no need for switches with back-to-back isolation which reduces die area and conversion loss. This proposed circuit also provides the benefits of capacitive bypass current. For instance the state D1 provides a parallel current path through the flying capacitor which reduces inductor current.

Figure 4:
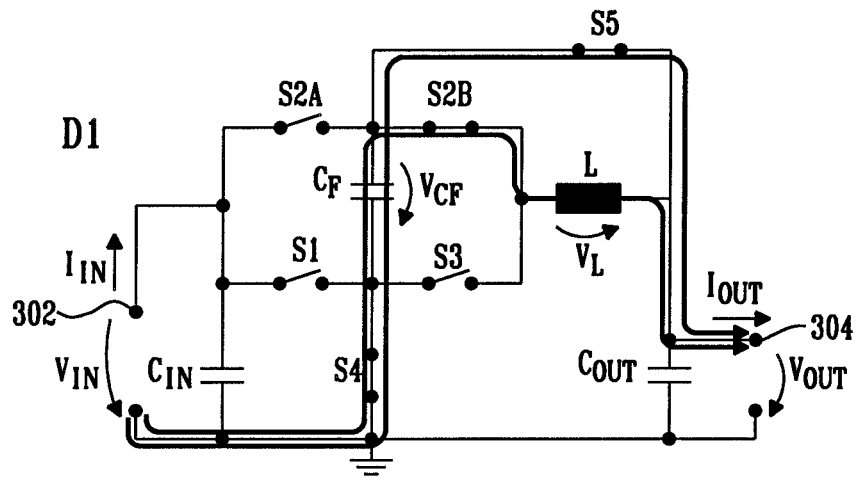
FIG. 4 is a diagram of the power converter of FIG. 3 operating in a first state D1.

FIG. 4 illustrates the DC-DC converter of FIG. 3 operating in the first state D1, in which the switches S2B, S4 and S5 are closed while the remaining switches S1, S2A and S3 are open. The ground port is coupled to the second port 304 via a first path and a second path. The first path comprises S4, the flying capacitor, S2B and the inductor. The second path comprises S4, the flying capacitor and S5, hence bypassing the inductor. The share of flying capacitor charge/discharge current which bypasses the inductor reduces the effective average inductor current. The reduced average inductor current reduces inductor conduction loss, hence improving converter efficiency. The voltage $V_L$ across the inductor is $V_L=V_{CF}-V_{OUT}=0$, as $V_{CF}=V_{OUT}$. As a result, the state D1 is a flat state, that is neither magnetizing nor de-magnetizing.

Figure 5:
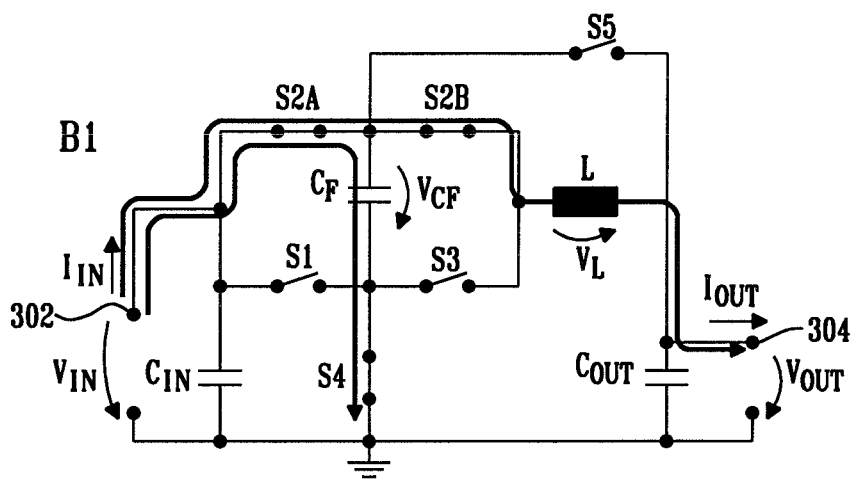
FIG. 5 is a diagram of the power converter of FIG. 3 operating in a second state B1.

FIG. 5 illustrates the DC-DC converter of FIG. 3 operating in the second state B1, in which the switches S2A, S2B and S4 are closed while the remaining switches S1, S3 and S5 are open. The first port 302 is coupled to the second port 304 via a path that includes S2A, S2B and the inductor. The ground port is coupled to the second port (304) via a path that includes S4, the flying capacitor, S2B and the inductor.

The voltage $V_L$ across the inductor is $V_L=V_{IN}-V_{OUT}$. The state B1 may be a magnetizing state, a de-magnetizing state or a flat state depending on the relation between $V_{IN}$ and $V_{OUT}$. For instance, if $V_{IN}>V_{OUT}$ then B1 is a magnetizing state. If $V_{IN}<V_{OUT}$ then B1 is a de-magnetizing state. If $V_{IN}=V_{OUT}$ B1 is a flat state that is neither magnetizing nor de-magnetizing.

The first state D1 and the second state B1 may be combined with other states in the driving sequence to achieve the desired conversion ratio. In order to fulfill the volt-sec balance across the inductor and the charge-balance across the capacitor there is at least one additional state required within the driving sequence. For a conversion ratio $V_{OUT}/V_{IN}=1$ the states D1 and B1 can be used together within a driving period.

Figure 6:
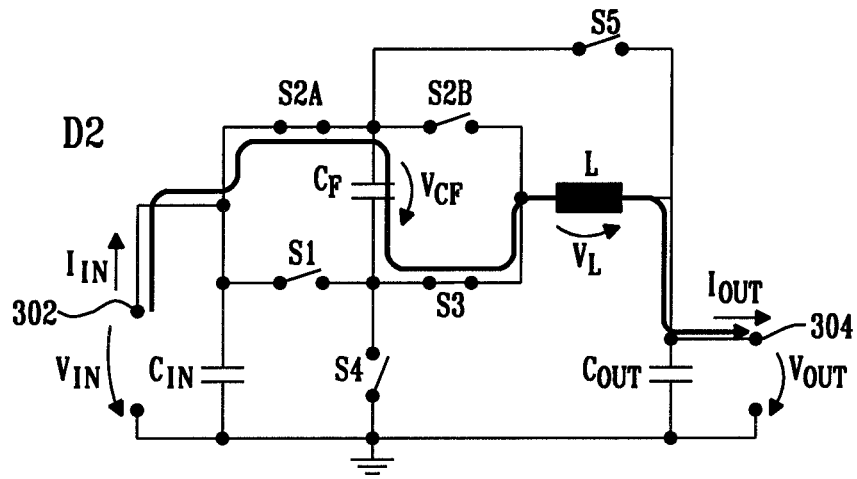
FIG. 6 is a diagram of the power converter of FIG. 3 operating in a third state D2.

FIG. 6 illustrates the DC-DC converter of FIG. 3 operating in a third state D2 in which the first port 302 is coupled to the second port 304 via a path that includes the switch S2A, the flying capacitor, the switch S3 and the inductor. The voltage $V_L$ across the inductor is $V_L=(V_{IN}-V_{CF})-V_{OUT}$. The state D2 may be a magnetizing state, a de-magnetizing state or a flat state depending on the relation between $V_{IN}$, $V_{CF}$ and $V_{OUT}$.

For instance, a switching sequence including the states D1 and D2 would achieve a voltage conversion ratio $V_{OUT}/V_{IN}$~½ (See FIG. 13 below). The switching sequence automatically controls the voltage $V_{CF}$ across the flying capacitor $C_F$ to $V_{CF}=V_{OUT}$.

The flying capacitance and the switching frequency may be selected so that the voltage $V_{CF}$ remains approximately constant throughout the switching sequence. For instance variations of less than a few hundred mV ripple for maximum output current.

Figure 7:
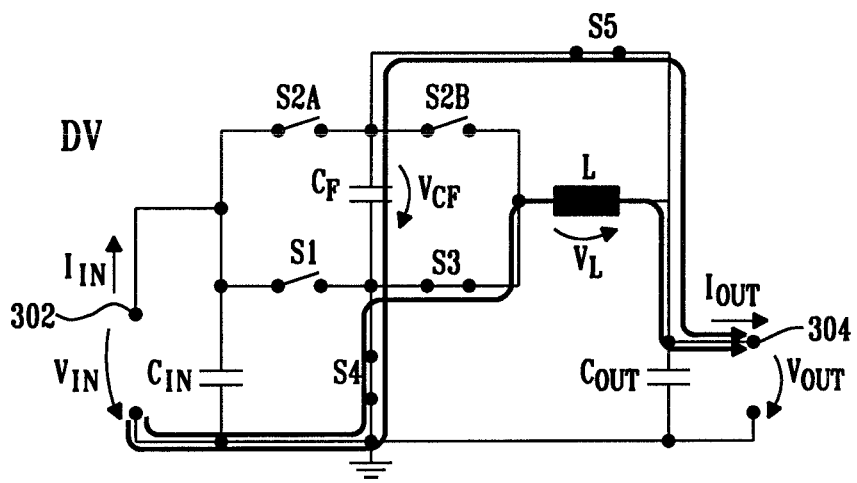
FIG. 7 is a diagram of the power converter of FIG. 3 operating in a fourth state DV.

FIG. 7 illustrates the DC-DC converter of FIG. 3 operating in a fourth state DV in which the ground port is coupled to the second port 304 via a first path and a second path. The first path includes S4, S3, and the inductor. The second path includes S4, the flying capacitor and S5, hence bypassing the inductor.

The state DV is a de-magnetization state that can be used in combination with the states D1 and D2 to achieve a voltage conversion ratios $V_{OUT}/V_{IN}<$½. An example switching sequence may be D1-DV-D2-DV and repeated for each driving period T.

Figure 8:
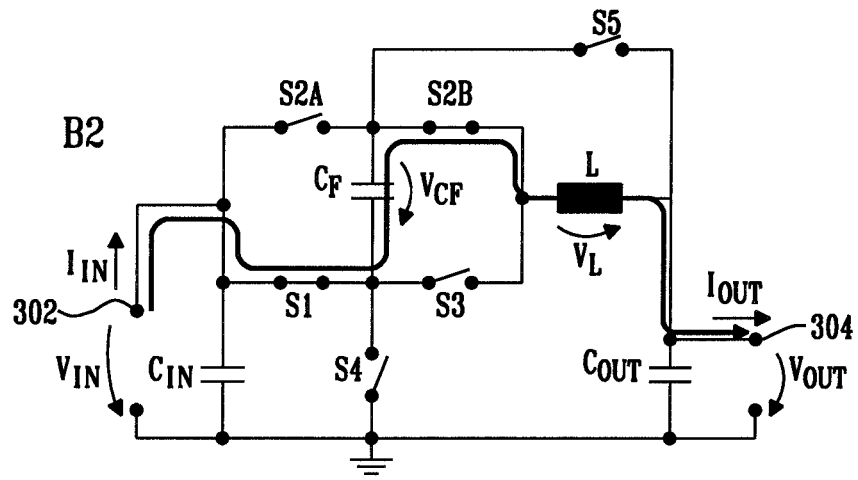
FIG. 8 is a diagram of the power converter of FIG. 3 operating in a fifth state B2.

FIG. 8 illustrates the DC-DC converter of FIG. 3 operating in a fifth state B2 in which the first port 302 is coupled to the second port 304 via a path that includes S1, the flying capacitor, S2B and the inductor. The voltage $V_L$ across the inductor is $V_L=V_{IN}+V_{CF}-V_{OUT}=2 V_{IN}-V_{OUT}$ with $(V_{CF}=V_{IN})$. The state B2 is either a magnetizing state, a de-magnetizing state or a flat state depending on the relation between $V_{IN}$ and $V_{OUT}$.

The state B2 may be used in combination with the states D1 and D2 to achieve a voltage conversion ratio in the range of ½$<V_{OUT}/V_{IN}<$1. An example switching sequence may be D1-B2-D2-B2 and repeated for each driving period T.

Therefore, in the first mode (step down) the first state D1 may be combined with D2 and also with one or more instances of the states DV or B2.

In the second mode (step up) the switching state D1 may be partially or fully replaced with the switching state B1. For instance B1 may be used in combination with D2 and B2.

Optionally, one or multiple magnetizations states DP may be inserted into the switching sequence additionally or as a replacement of other switching states.

Figure 9:
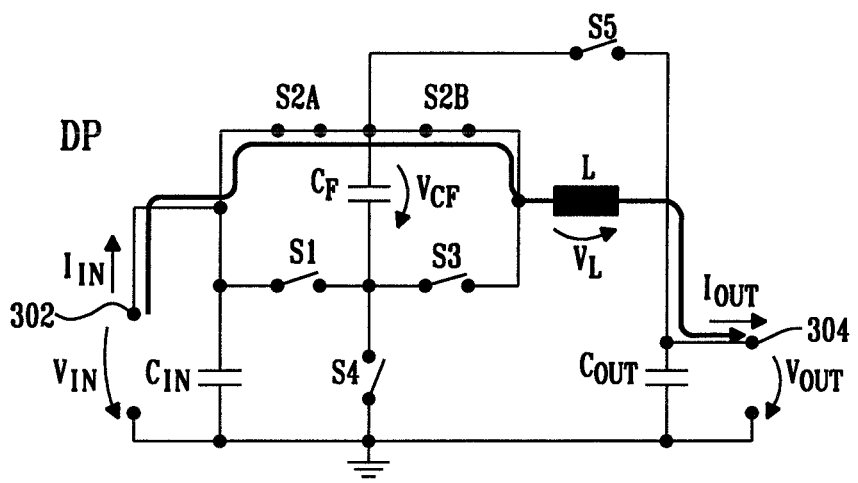
FIG. 9 is a diagram of the power converter of FIG. 3 operating in a sixth state DP.

FIG. 9 illustrates the DC-DC converter of FIG. 3 operating in a sixth state DP in which the first port 302 is coupled to the second port 304 via a path that includes S2A, S2B, and the inductor. The state DP is a magnetizing state in buck mode (de-magnetizing in boost operation).

By applying the volt-sec balance principle to the voltage of the inductor the below example operation may be implemented:

$$\frac{V_{OUT}}{V_{IN}} = \frac{3D}{1+2D} \quad D1 = D, D2 = 3D, 2DV = 1-4D \quad D \in [0, 0.25] \quad (1)$$

$$\frac{V_{OUT}}{V_{IN}} = \frac{1+2D}{4-4D} \quad D1 = \frac{1}{2} - D, \quad (2)$$

$$D2 = 1-D, 2B2 = 2D - \frac{1}{2} \quad D \in [0.25, 0.5]$$

$$\frac{V_{OUT}}{V_{IN}} = \frac{6D+1}{4} \quad D2 = 1-D, B1 = \frac{D}{2} - \frac{1}{4}, 2B2 = \frac{D}{2} + \frac{1}{4} \quad D \in [0.5, 1] \quad (3)$$

The parameter D, also referred to as duty cycle parameter is used to describe and compare the operation of different converter topologies. D restricts the minimum and maximum voltage conversion ratio within a specific operation mode. The sequences are presented so that for (1) 2DV+D1+D2=1, for (2) 2B2+D1+D2=1 and for (3) 2B2+B1+D2=1. The equations above define just one possible example operation however other relations could be considered.

Figure 10:
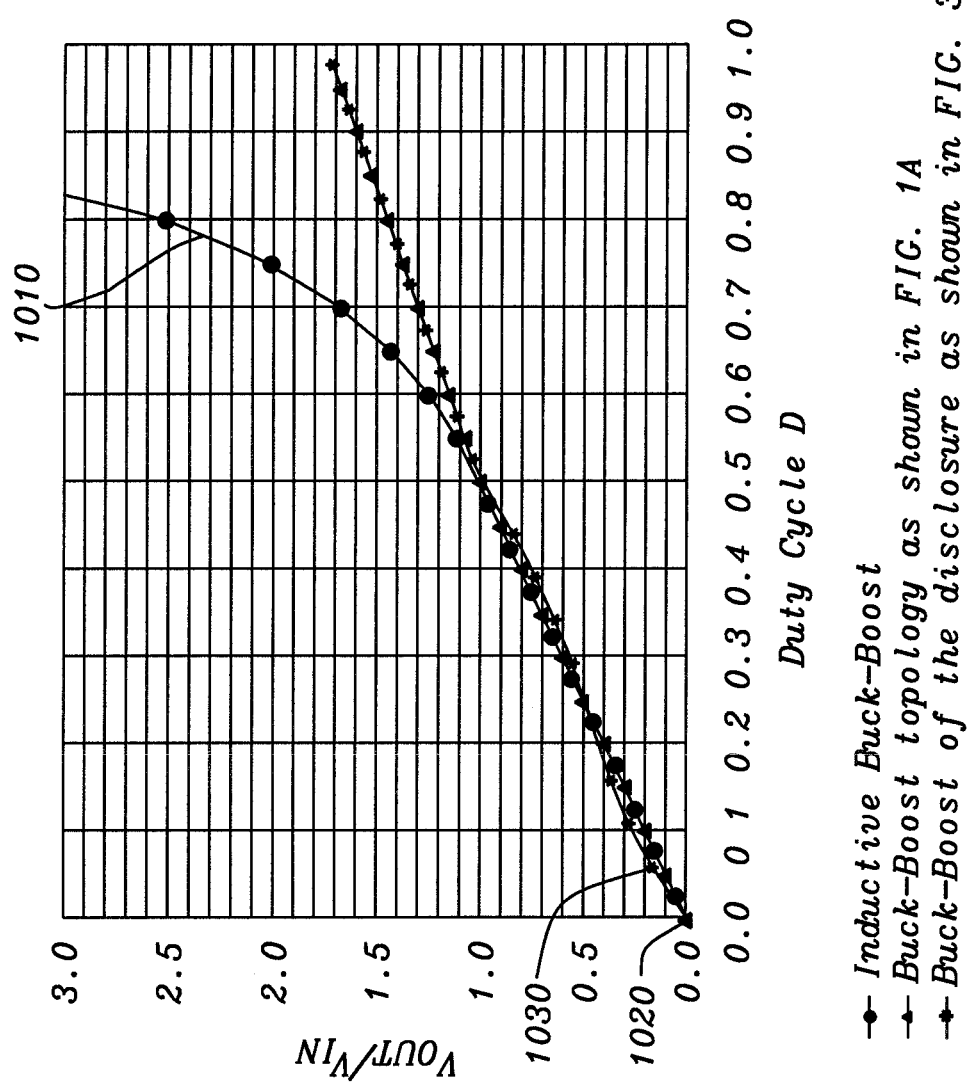
FIG. 10 is a plot of the voltage conversion ratio $V_{OUT}/V_{IN}$ as a function of the duty cycle of the switching states obtained for different buck-boost topologies.

FIG. 10 is a plot showing the relation between the duty cycle of the switching states D and the voltage conversion ratio $V_{OUT}/V_{IN}$ for a traditional inductive buck-boost (1010), a buck-boost converter as shown in FIG. 1A (1020), the buck-boost of the disclosure as shown in FIG. 3 (1030).

For charge-balance of the flying capacitor $C_F$ the switch S5 must be closed during the switching state D1 or DV or both D1 and DV. If the switch S5 is closed during both states D1 and DV, the average current $I_L$ through the inductor is reduced in comparison to the average output current $I_{OUT}$ according to:

$$\frac{I_L}{I_{OUT}} = \frac{1}{2+D} \quad D1 = D, D2 = 3D, 2DV = 1-4D \quad D \in [0, 0.25] \quad (4)$$

$$\frac{I_L}{I_{OUT}} = \frac{1}{2-2D} \quad D1 = \frac{1}{2} - D, D2 = 1-D, \quad (5)$$

$$2B2 = 2D - \frac{1}{2}, D \in [0.25, 0.5]$$

$$\frac{I_L}{I_{OUT}} = 1 \quad D2 = 1-D, B1 = \frac{D}{2} - \frac{1}{4}, 2B2 = \frac{D}{2} + \frac{1}{4} \quad D \in [0.5, 1] \quad (6)$$

Figure 11:
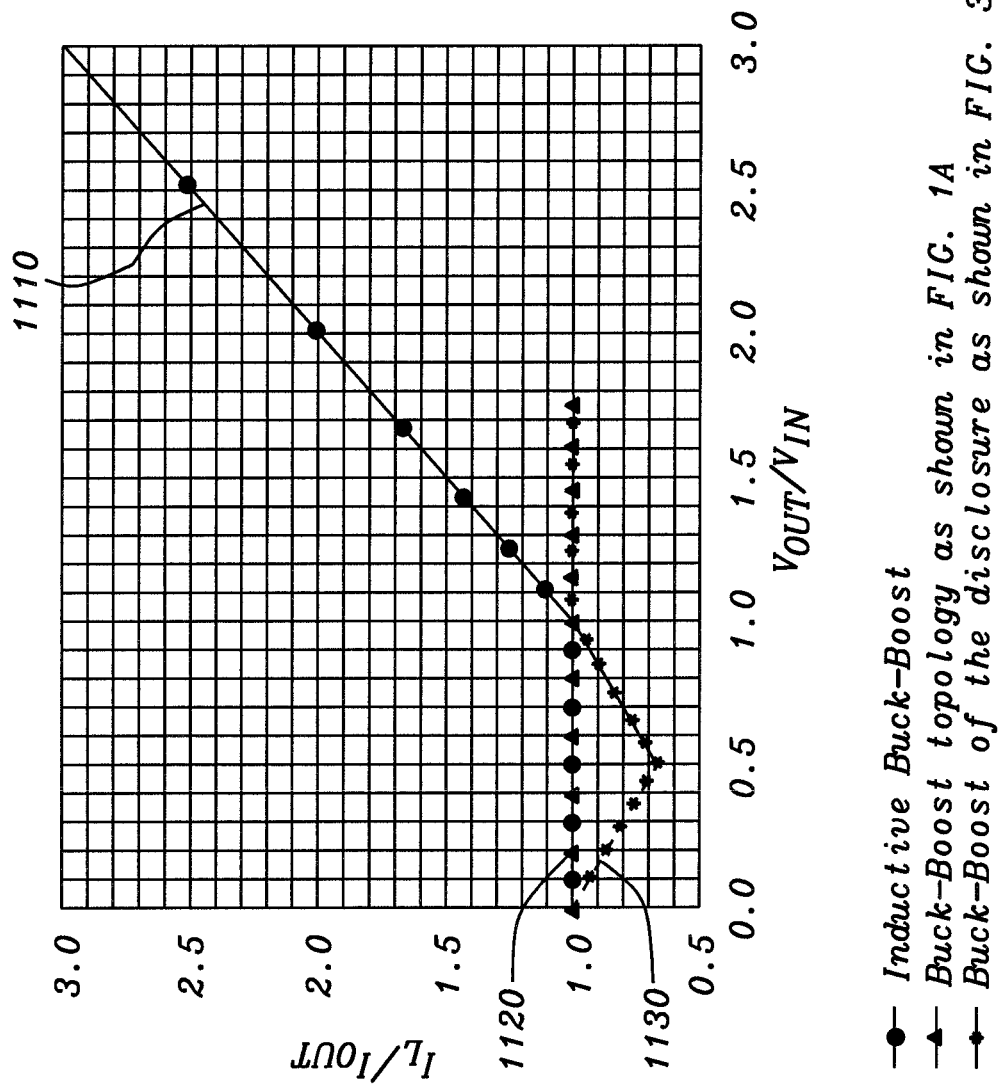
FIG. 11 is a plot of the ratio $I_L/I_{OUT}$ as a function of the voltage conversion ratio $V_{OUT}/V_{IN}$ obtained for different buck-boost topologies.

FIG. 11 shows the ratio $I_L/I_{OUT}$ as a function of the voltage conversion ratio $V_{OUT}/V_{IN}$ for a conventional inductive buck-boost topology (1110), a buck-boost converter as shown in FIG. 1A (1120), and the buck-boost of the disclosure as shown in FIG. 3 (1130).

For the prior art topologies the average current through the inductor $I_L$ is independent from the voltage ratio and identical to the output current $I_{OUT}$ during step-down conversion.

In contrast, during step-down conversion the converter of FIG. 3 reduces the average inductor current $I_L$ by up to 33% for $V_{OUT}/V_{IN}=\frac{1}{2}$, hence reducing inductor conduction loss. In comparison to the inductive buck-boost converter the average inductor current is reduced also for voltage conversion ratios $V_{OUT}/V_{IN}>1$. This permits to select an inductor with a reduced saturation current $I_{SAT}$, hence a smaller footprint.

The inductor peak-to-peak current ripple $\Delta I_L$ is expressed according to:

$$\Delta I_L = \frac{V_{IN}}{2Lf_{SW}} \frac{3D}{1+2D}(1-4D), D1 = D, \quad (7)$$

$$D2 = 3D, 2DV = 1-4D, D \in [0, 0.25]$$

$$\Delta I_L = \frac{V_{IN}}{2Lf_{SW}}\left(2D - \frac{1}{2}\right), D1 = \frac{1}{2} - D, \quad (8)$$

$$D2 = 1-D, 2B2 = 2D - \frac{1}{2}, D \in [0.25, 0.5]$$

$$\Delta I_L = \frac{V_{IN}}{2Lf_{SW}}\left(\frac{7}{4} - \frac{3D}{2}\right)\left(\frac{1}{4} + \frac{D}{2}\right) D2 = 1-D, \quad (9)$$

$$B1 = \frac{D}{2} - \frac{1}{4}, 2B2 = \frac{D}{2} + \frac{1}{4} \quad D \in [0.5, 1]$$

In equations 7-9 $f_{SW}$ is the converter switching frequency.

Figure 12:
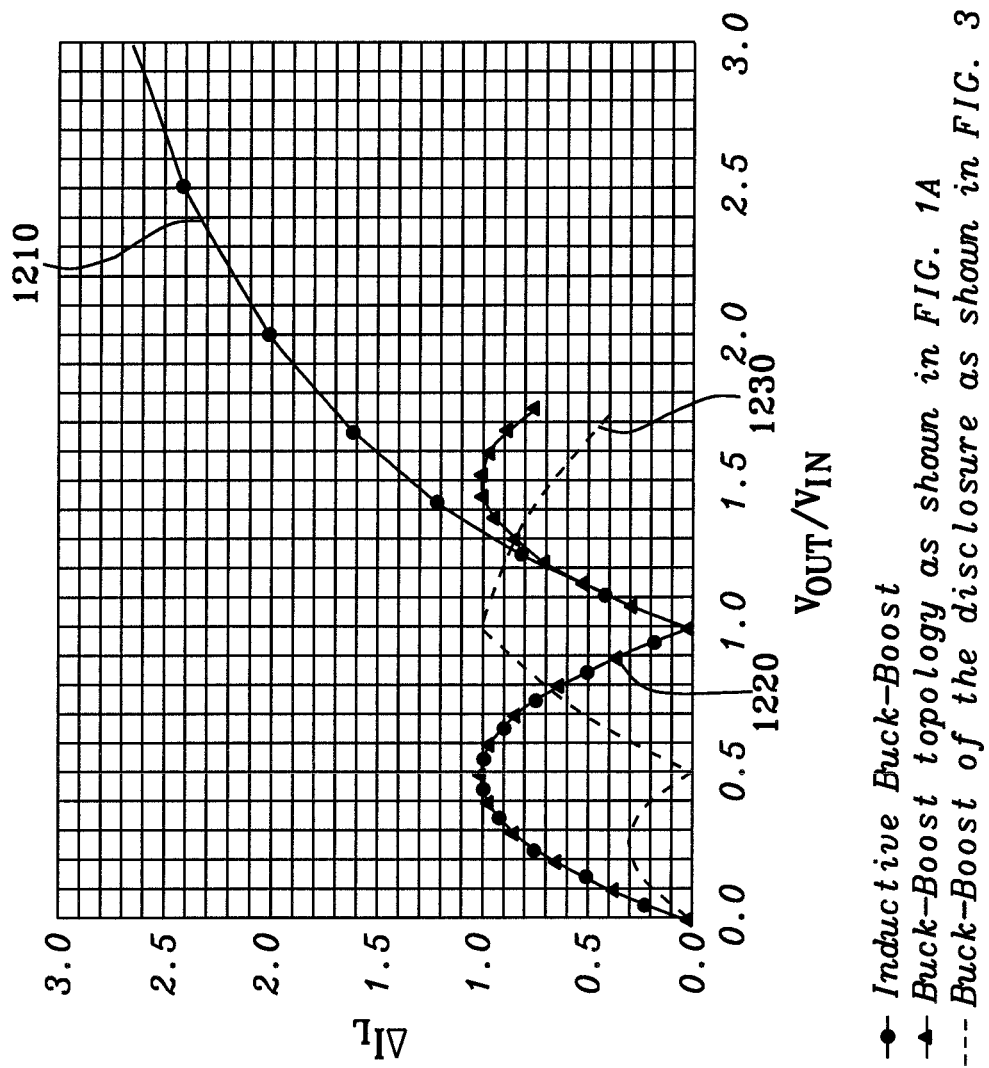
FIG. 12 is a plot of the inductor peak-to-peak current ripple as a function of the voltage conversion ratio $V_{OUT}/V_{IN}$ obtained for different buck-boost topologies.

FIG. 12 shows the inductor peak-to-peak current ripple as a function of the voltage conversion ratio $V_{OUT}/V_{IN}$ for a conventional inductive buck-boost topology (1210), a buck-boost converter as shown in FIG. 1A (1220), and the buck-boost of the disclosure as shown in FIG. 3 (1230). For each topology he inductor current ripple is shown for an input voltage of $V_{IN}=4$ V, an inductor L=1 µH and a converter switching frequency $f_{SW}=1$ MHz.

When operating in step-down mode with $V_{OUT}/V_{IN}<0.8$, the peak-to-peak current ripple of the topology of FIG. 3 is significantly reduced compared with the peak-to-peak current ripple of the prior art topologies. Reduced inductor current ripple enables lower inductance and/or lower switching frequency. Lower switching frequency permits to reduce switching loss and improves converter efficiency.

When operating in step-down mode with a voltage conversion ratio around $V_{OUT}/V_{IN}=0.5$ the peak-to-peak current ripple is null. This is useful for several applications including for powering a vertical-cavity surface-emitting laser (VCSEL).

Figure 13:
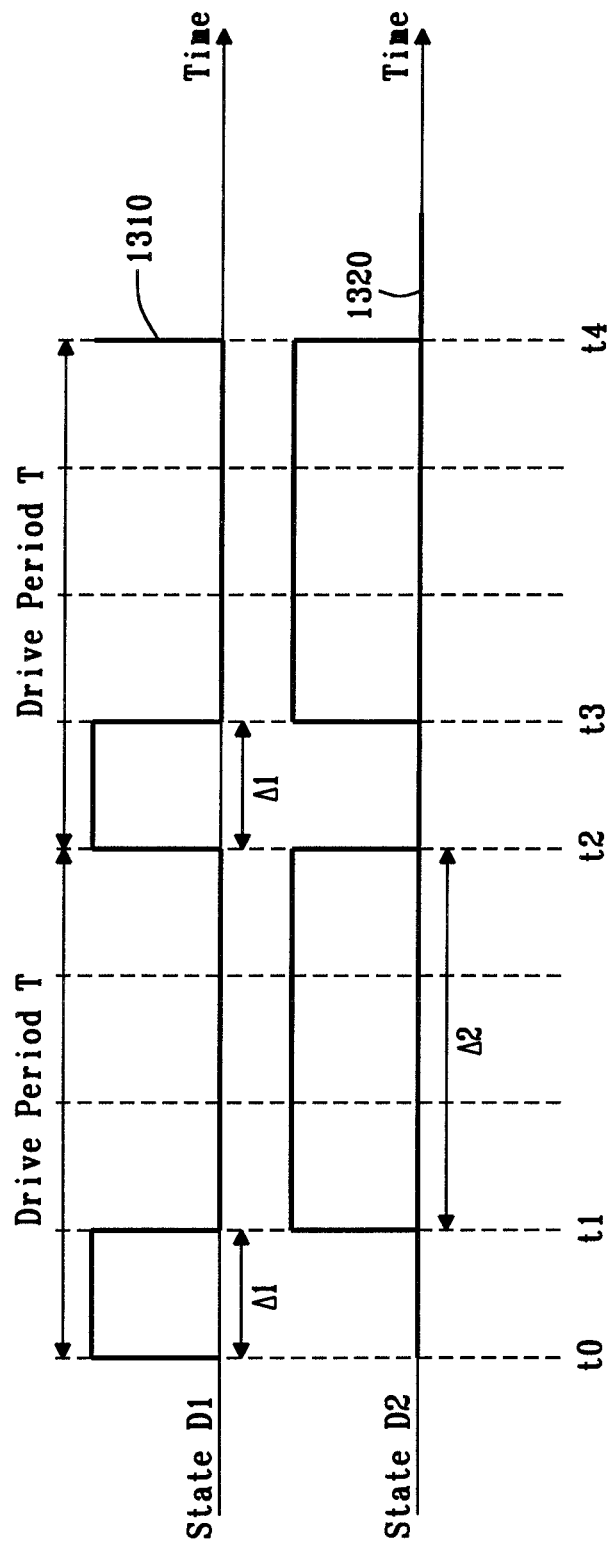
FIG. 13 is a plot of a drive sequence for operating the power converter of FIG. 3 with a conversion ratio of $V_{OUT}/V_{IN}=\frac{1}{2}$.

FIG. 13 illustrates a drive sequence for operating the DC-DC converter of FIG. 3 with a conversion ratio $$\frac{V_{out}}{V_{in}} = \frac{1}{2}.$$

The duty cycle D is ¼ and the driving sequence is defined by equation (1) or equation (2). A possible sequence is D1-D2. In this example, the driver 320 drives the DC-DC converter 300 with the state D1 (waveform 1310), between the times t0 and t1 for a duration Δ1=1/4T, then with the state D2 (waveform 1320) between the time t1 and t2 for a duration Δ2=3/4T. This sequence is then repeated over time to deliver the required output power.

Figure 14:
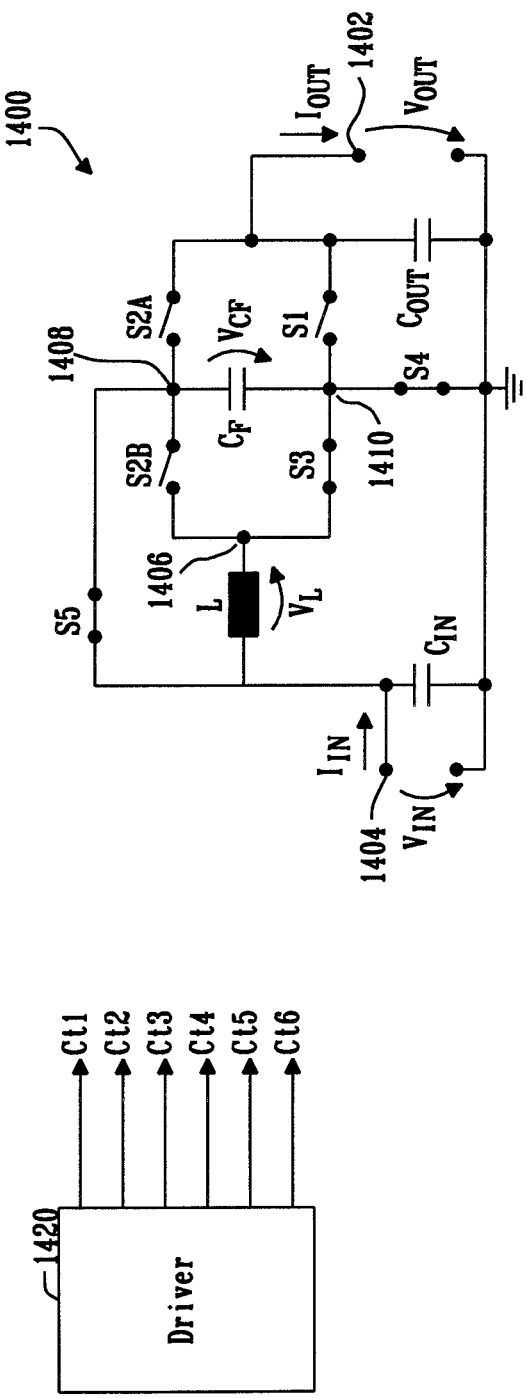
FIG. 14 is a diagram of another power converter for implementing the method of FIG. 2.

FIG. 14 shows a diagram of another buck-boost power converter for implementing the method of FIG. 2. The power converter 1400 is obtained by reversing the input and output ports of the circuit of FIG. 3. The power converter 1400 has a ground port, a first port 1402 and a second port 1404. In this example the first port 1402 is an output port for providing an output voltage and the second port 1404 is an input port for receiving an input voltage. The power converter 1400 includes a single inductor L, a single flying capacitor $C_F$ and a network of switches formed of six switches S1, S2A, S2B, S3, S4, S5. The inductor L has a first terminal connected to the second port 1404 and a second terminal connected to S3 and S2B at node 1406. The flying capacitor $C_F$ has a first terminal at node 1408 and a second terminal at node 1410. The flying capacitor first terminal is coupled to the first port 1402 via the switch S2A, to the inductor second terminal (node 1406) via switch S2B and to the second port 1404 via the switch S5. The flying capacitor second terminal is coupled to the first port 1402 via the switch S1, to the inductor second terminal via switch S3 and to ground via the switch S4.

A driver 1420 is provided to generate a plurality of control signals Ct1, Ct2, Ct3, Ct4, Ct5, Ct6 to operate the switches S1, S2A, S2B, S3, S4 and S5 respectively. The driver 1420 is adapted to operate the converter 300 with a sequence of states during a drive period T. Depending on the mode of operation being selected (first mode for step-down conversion or second mode for a step-up conversion) the sequence of states comprises a first state (D1') or a second state (B1').

Compared with the buck-boost converter 300 of FIG. 3, the buck-boost converter 1400 of FIG. 14 has a limited step-down conversion ratio $V_{OUT}/V_{IN}>\frac{1}{2}$ but an extended step-up conversion range. In comparison to the topology of FIG. 3, the switching states with inductor demagnetization become states with inductor magnetization and vice versa.

Figure 15:
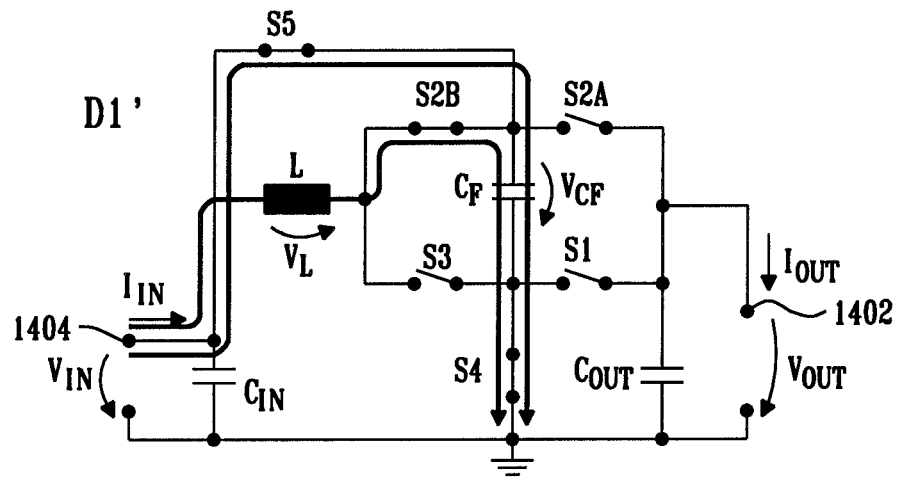
FIG. 15 is a diagram of the power converter of FIG. 14 operating in a first state D1'.

FIG. 15 illustrates the DC-DC converter of FIG. 14 operating in the first state D1', in which the switches S2B, S4 and S5 are closed while the remaining switches S1, S2A and S3 are open. The second port 1404 (input port) is coupled to the ground port via a first path and a second path. The first path comprises L, S2B, $C_F$, and S4. The second path comprises S5, $C_F$, and S4, hence bypassing the inductor.

Figure 16:
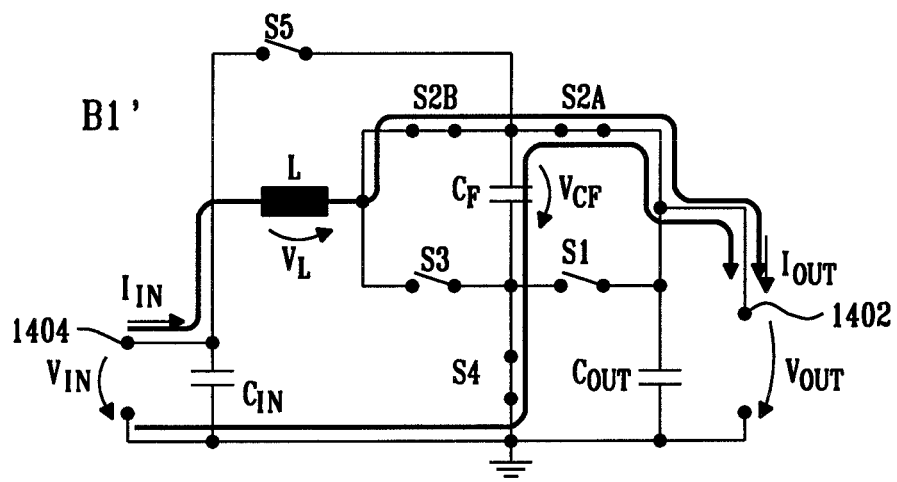
FIG. 16 is a diagram of the power converter of FIG. 14 operating in a second state B1'.

FIG. 16 illustrates the DC-DC converter of FIG. 14 operating in the second state B1', in which the switches S2A, S2B and S4 are closed while the remaining switches S1, S3 and S5 are open. The second port 1404 (input port) is coupled to the first port 1402 (output port) via a path that includes L, S2B, S2A. The ground port is coupled to the first port 1402 (output port) via a path that includes S4, $C_F$, S2A, hence bypassing the inductor.

Figure 17:
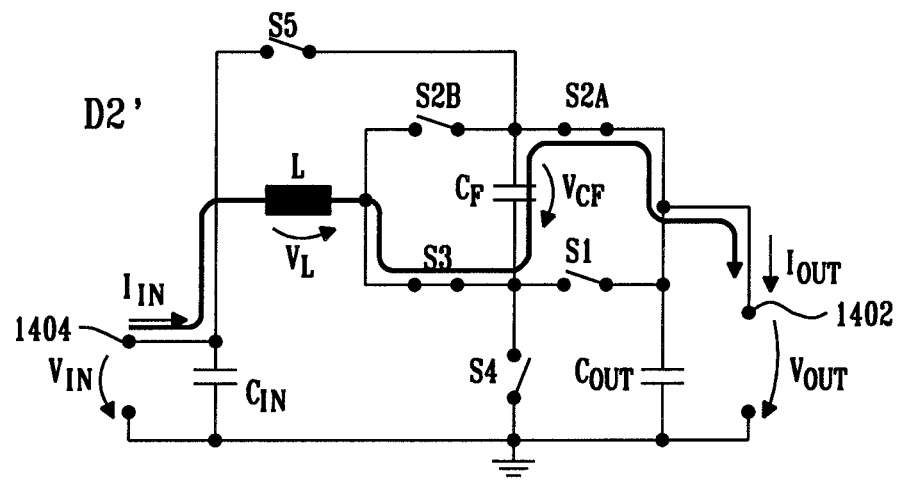
FIG. 17 is a diagram of the power converter of FIG. 14 operating in a third state D2'.

FIG. 17 illustrates the DC-DC converter of FIG. 14 operating in a third state D2' in which the second port 1404 (input port) is coupled to the first port 1402 (output port) via a path that includes L, S3, $C_F$, S2A.

Figure 18:
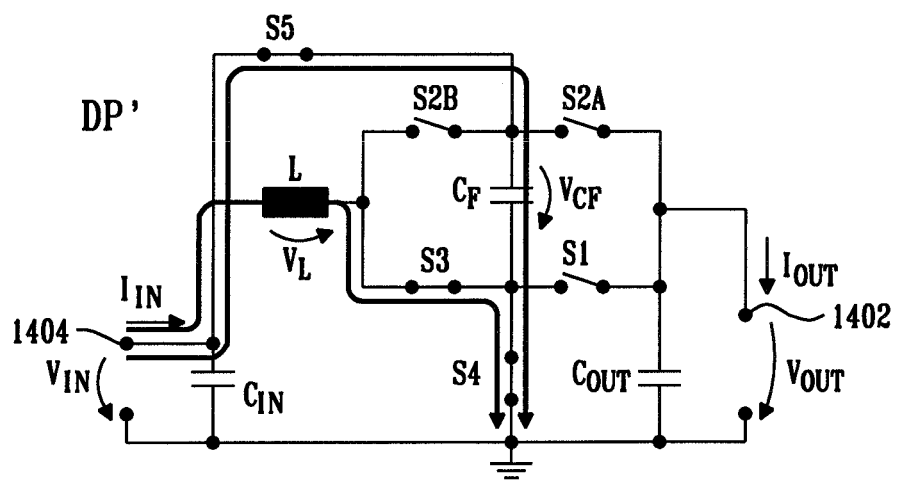
FIG. 18 is a diagram of the power converter of FIG. 14 operating in a fourth state DP'.

FIG. 18 illustrates the DC-DC converter of FIG. 14 operating in a fourth state DP' in which the second port (input port) 1404 is coupled to the ground port via a first path and a second path. The first path includes L, S3, S4, hence bypassing the flying capacitor. The second path includes S5, $C_F$, and S4, hence bypassing the inductor. The state DP' is a magnetization state.

Figure 19:
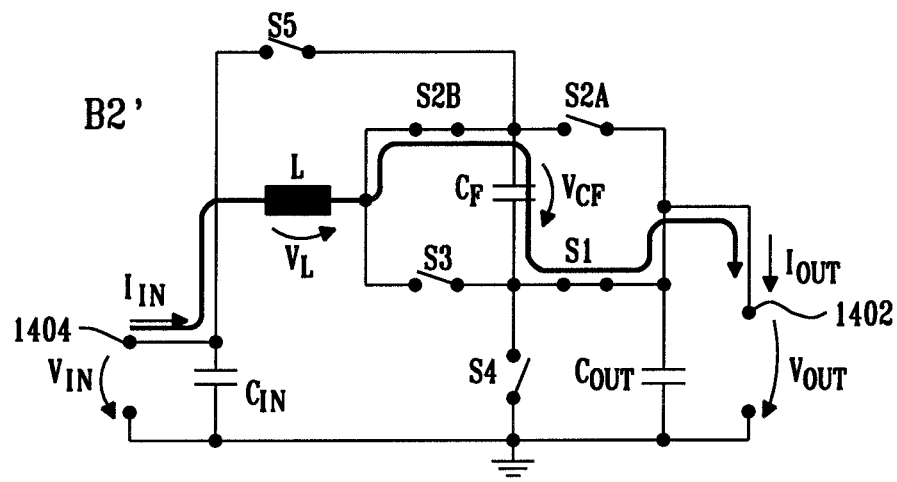
FIG. 19 is a diagram of the power converter of FIG. 14 operating in a fifth state B2'.

FIG. 19 illustrates the DC-DC converter of FIG. 14 operating in a fifth state B2' in which the second port (input port) 1404 is coupled to the first port (output port) 1402 via a path that L, S2B, $C_F$, S1.

Figure 20:
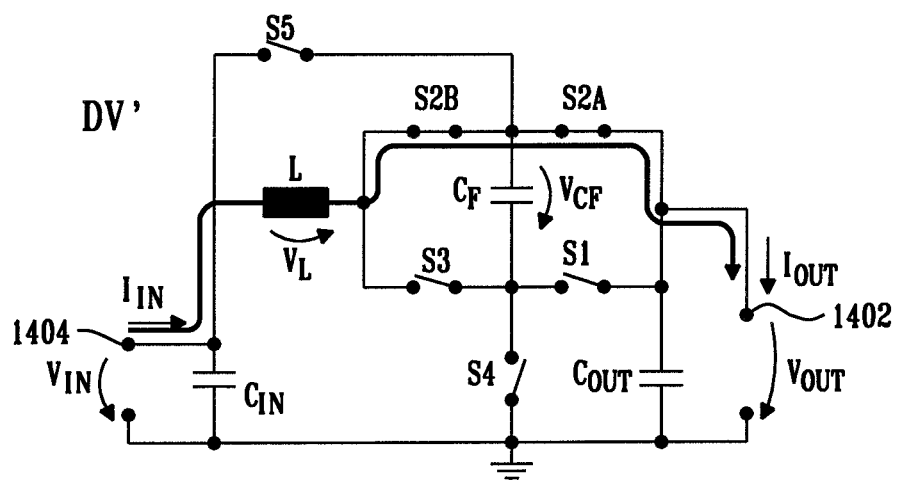
FIG. 20 is a diagram of the power converter of FIG. 14 operating in a sixth state DV'.

FIG. 20 illustrates the DC-DC converter of FIG. 14 operating in a sixth state DV' in which the second port (input port) 1404 is coupled to the first port 1402 via a path that includes L, S2B, S2A.

During step-down conversion the switching sequence may contain the states D2', B1' and B2'.

Alternating the switching states D2' and B2' at a duty cycle of 50% results in a voltage conversion ratio of $V_{OUT}/V_{IN} \sim 1$. (See equation 11 below).

For voltage conversion ratios in the range of $V_{OUT}/V_{IN} < 1$ one or multiple switching states B1' may be inserted into the switching sequence. The switching sequence then automatically controls the voltage $V_{CF}$ across the flying capacitor $C_F$ to $V_{CF}=V_{OUT}$. An example switching sequence may be B1'-B2'-D2'-B2' and repeated for each driving period T.

For voltage conversion ratios in the range of $1 < V_{OUT}/V_{IN} < 2$ one or multiple switching states D1' may be inserted instead of state B1'. The switching sequence then automatically controls the voltage $V_{CF}$ across the flying capacitor $C_F$ to $V_{CF}=V_{IN}$. An example switching sequence may be D1'-B2'-D2'-B2' and repeated for each driving period T.

For voltage conversion ratios in the range of $2<V_{OUT}/V_{IN}$ the switching states B2' may be partially or fully replaced with the switching state DP'.

Optionally one or multiple switching states DV' may be inserted into switching sequence either additionally or as a replacement of other switching states.

By applying the volt-sec balance principle to the voltage of the inductor the below example operation may be implemented:

$$\frac{V_{OUT}}{V_{IN}} = \frac{4}{7-12D} \quad D2' = 2D, \tag{10}$$

$$B1' = \frac{1}{4} - D, \, 2B2' = \frac{3}{4} - D \; D \in [0, 0.25]$$

$$\frac{V_{OUT}}{V_{IN}} = \frac{8D+2}{5-4D} \quad D1' = D - \frac{1}{4}, \tag{11}$$

$$D2' = D + \frac{1}{4}, \, 2B2' = 1 - 2D \; D \in [0.25, 0.5]$$

$$\frac{V_{OUT}}{V_{IN}} = \frac{4-2D}{3-3D} \quad D1' = \frac{1}{2} - \frac{D}{2}, \tag{12}$$

$$D2' = \frac{3}{2} - \frac{3D}{2}, \, 2DP' = 2D - 1 \; D \in [0.5, 1]$$

The parameter D, also referred to as duty cycle parameter is used to describe and compare the operation of different converter topologies. D restricts the minimum and maximum voltage conversion ratio within a specific operation mode. The sequences are presented so that for (10) 2B2'+B1'+D2'=1, for (11) 2B2'+D1'+D2'=1 and for (12) 2DP'+D1'+D2'=1. The equations above define just one possible example operation however other relations could be considered.

Figure 21:
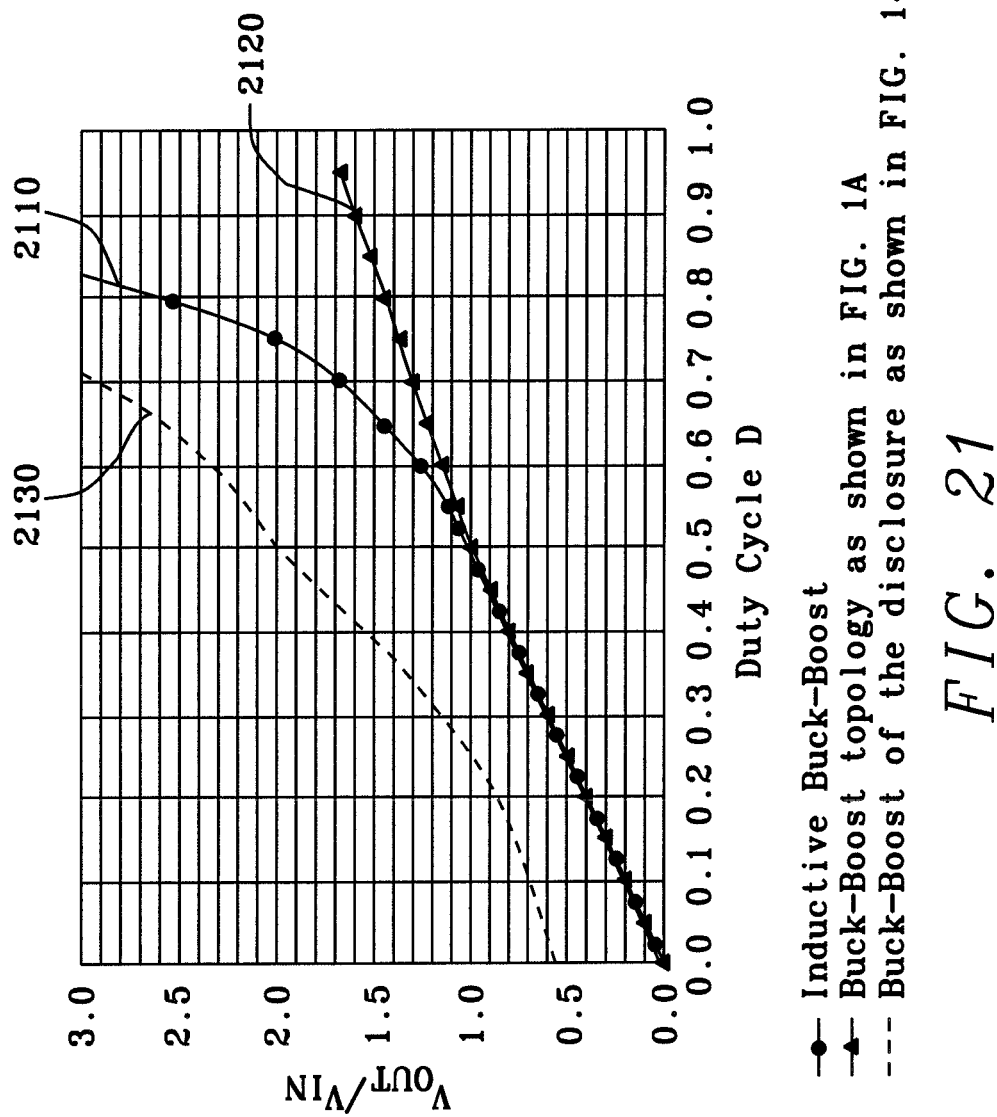
FIG. 21 is a plot of the voltage conversion ratio $V_{OUT}/V_{IN}$ as a function of the duty cycle of the switching states obtained for different buck-boost topologies.

FIG. 21 is a plot showing the relation between the duty cycle of the switching states D and the voltage conversion ratio $V_{OUT}/V_{IN}$ for a traditional inductive buck-boost (2110), a buck-boost converter as shown in FIG. 1A (2120), the buck-boost of the disclosure as shown in FIG. 14 (2130).

For charge-balance of the flying capacitor CF the switch S5 must be closed during switching state D1' or DP' or both D1' and DP'. If closed during both states, the average current $I_L$ through the inductor is reduced in comparison to the average output current $I_{OUT}$ according to:

$$\frac{I_L}{I_{OUT}} = \frac{4}{7-12D} \quad D2' = 2D, B1' = \frac{1}{4} - D, 2B2' = \frac{3}{4} - D \quad D \in [0, 0.25] \quad (13)$$

$$\frac{I_L}{I_{OUT}} = \frac{4}{5-4D} \quad D1' = D - \frac{1}{4}, \quad (14)$$

$$D2' = D + \frac{1}{4}, 2B2' = 1 - 2D \quad D \in [0.25, 0.5]$$

$$\frac{I_L}{I_{OUT}} = \frac{2}{3-3D} \quad D1' = \frac{1}{2} - \frac{D}{2}, \quad (15)$$

$$D2' = \frac{3}{2} - \frac{3D}{2}, 2DP' = 2D - 1 \quad D \in [0.5, 1]$$

Figure 22:
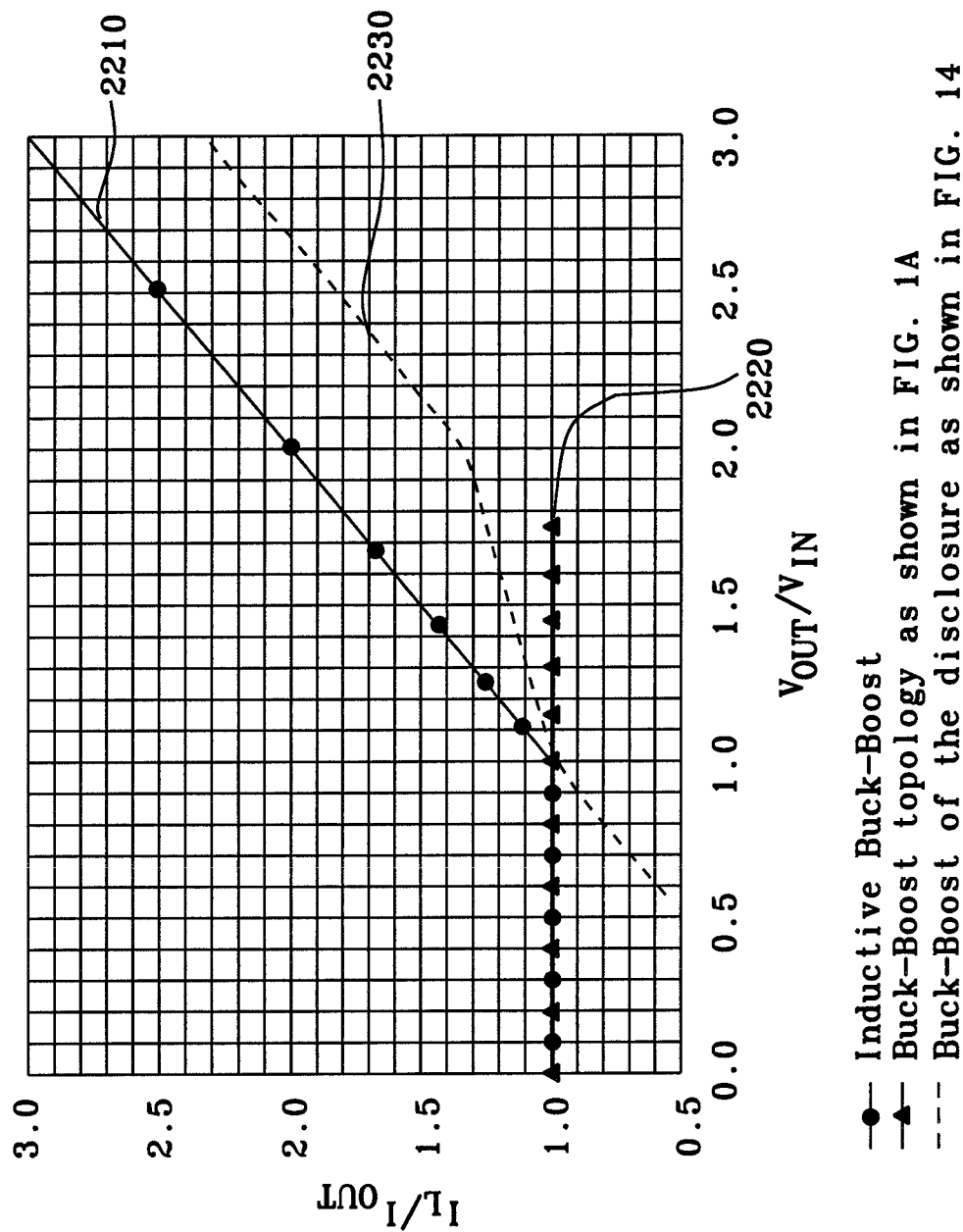
FIG. 22 is a plot of the ratio $I_L/I_{OUT}$ as a function of the voltage conversion ratio $V_{OUT}/V_{IN}$ obtained for different buck-boost topologies.

FIG. 22 shows the ratio $I_L/I_{OUT}$ as a function of the voltage conversion ratio $V_{OUT}/V_{IN}$ for a conventional inductive buck-boost topology (2210), a buck-boost converter as shown in FIG. 1A (2220), and the buck-boost of the disclosure as shown in FIG. 14 (2230).

For the prior art topologies the average current through the inductor $I_L$ is independent from the voltage ratio and identical to the output current $I_{OUT}$ during step-down conversion.

In contrast, during step-down conversion the converter of FIG. 14 reduces the average inductor current $I_L$ by more than 40% for $V_{OUT}/V_{IN}=4/7$, hence reducing inductor conduction loss. Compared with the inductive buck-boost converter, the average inductor current is reduced also for voltage conversion ratios $V_{OUT}/V_{IN}>1$. This permits to select an inductor with a reduced saturation current $I_{SAT}$.

The inductor peak-to-peak current ripple $\Delta I_L$ is expressed according to the following equations:

$$\Delta I_L = \frac{V_{IN}}{2Lf_{SW}} \left(\frac{1+12D}{7-12D}\right)\left(\frac{3}{4} - D\right) \quad D2' = 2D, \quad (16)$$

$$B1' = \frac{1}{4} - D, 2B2' = \frac{3}{4} - D \quad D \in [0, 0.25]$$

$$\Delta I_L = \frac{V_{IN}}{2Lf_{SW}} \left(\frac{8D+2}{5-4D}\right)(1 - 2D), D1' = D - \frac{1}{4}, \quad (17)$$

$$D2' = D + \frac{1}{4}, 2B2' = 1 - 2D \quad D \in [0.25, 0.5]$$

$$\Delta I_L = \frac{V_{IN}}{2Lf_{SW}}(2D - 1), D1' = \frac{1}{2} - \frac{D}{2}, \quad (18)$$

$$D2' = \frac{3}{2} - \frac{3D}{2}, 2DP' = 2D - 1 \quad D \in [0.5, 1]$$

Figure 23:
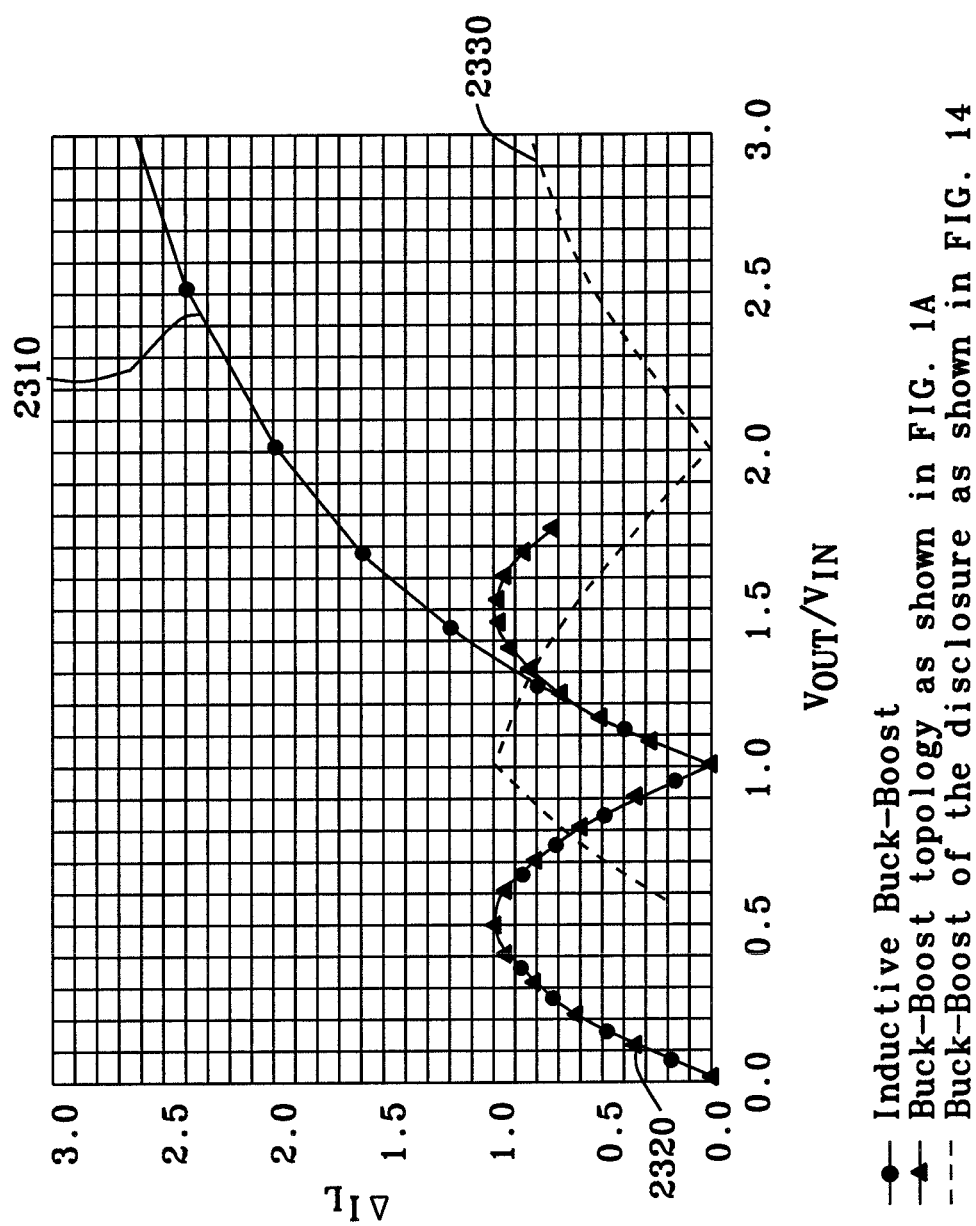
FIG. 23 is a plot of the inductor peak-to-peak current ripple as a function of the voltage conversion ratio $V_{OUT}/V_{IN}$ obtained for different buck-boost topologies.

FIG. 23 shows the inductor peak-to-peak current ripple as a function of the voltage conversion ratio $V_{OUT}/V_{IN}$ for a conventional inductive buck-boost topology (2310), a buck-boost converter as shown in FIG. 1A (2320), and the buck-boost of the disclosure as shown in FIG. 14 (2330). For each topology the inductor current ripple is shown for an input voltage of $V_{IN}=4$ V, an inductor L=1 μH and a converter switching frequency $f_{SW}=1$ MHz.

When operating in step-up mode with a voltage conversion ratio $V_{OUT}/V_{IN}$ greater than about 1.2 or 1.3, the peak-to-peak current ripple of the topology of FIG. 14 is significantly reduced compared with the peak-to-peak current ripple of the prior art topologies. When operating in step-up mode with a voltage conversion ratio around $V_{OUT}/V_{IN}=2$ the peak-to-peak current ripple is null.

Figure 24:
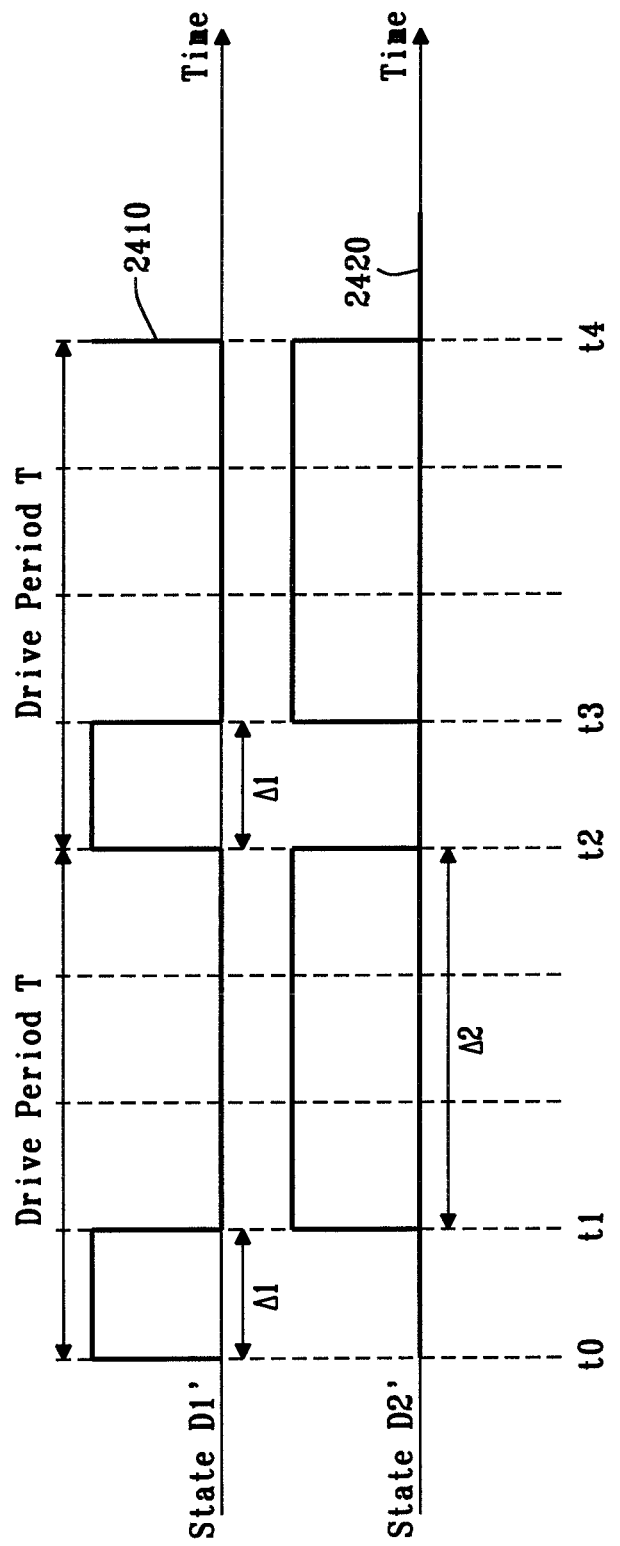
FIG. 24 is a plot of a drive sequence for operating the power converter of FIG. 14 with a conversion ratio of $V_{OUT}/V_{IN}=2$.

FIG. 24 illustrates a drive sequence for operating the DC-DC converter of FIG. 14 with a conversion ratio $$\frac{V_{out}}{V_{in}} = 2.$$

The duty cycle D is ½ and the driving sequence is defined by equation (11). A possible sequence is D1'-D2'. In this example, the driver 1420 drives the DC-DC converter 1400 with the state D1' (waveform 2410), between the times t0 and t1 for a duration Δ1=1/4T, then with the state D2' (waveform 2420) between the time t1 and t2 for a duration Δ2=3/4T. This sequence is then repeated over time to deliver the required output power.

The power converter of the disclosure may be used in a variety of applications. For instance, the power converter may be used to power a display of a user device such as a tablet or a mobile phone.

Figure 25:
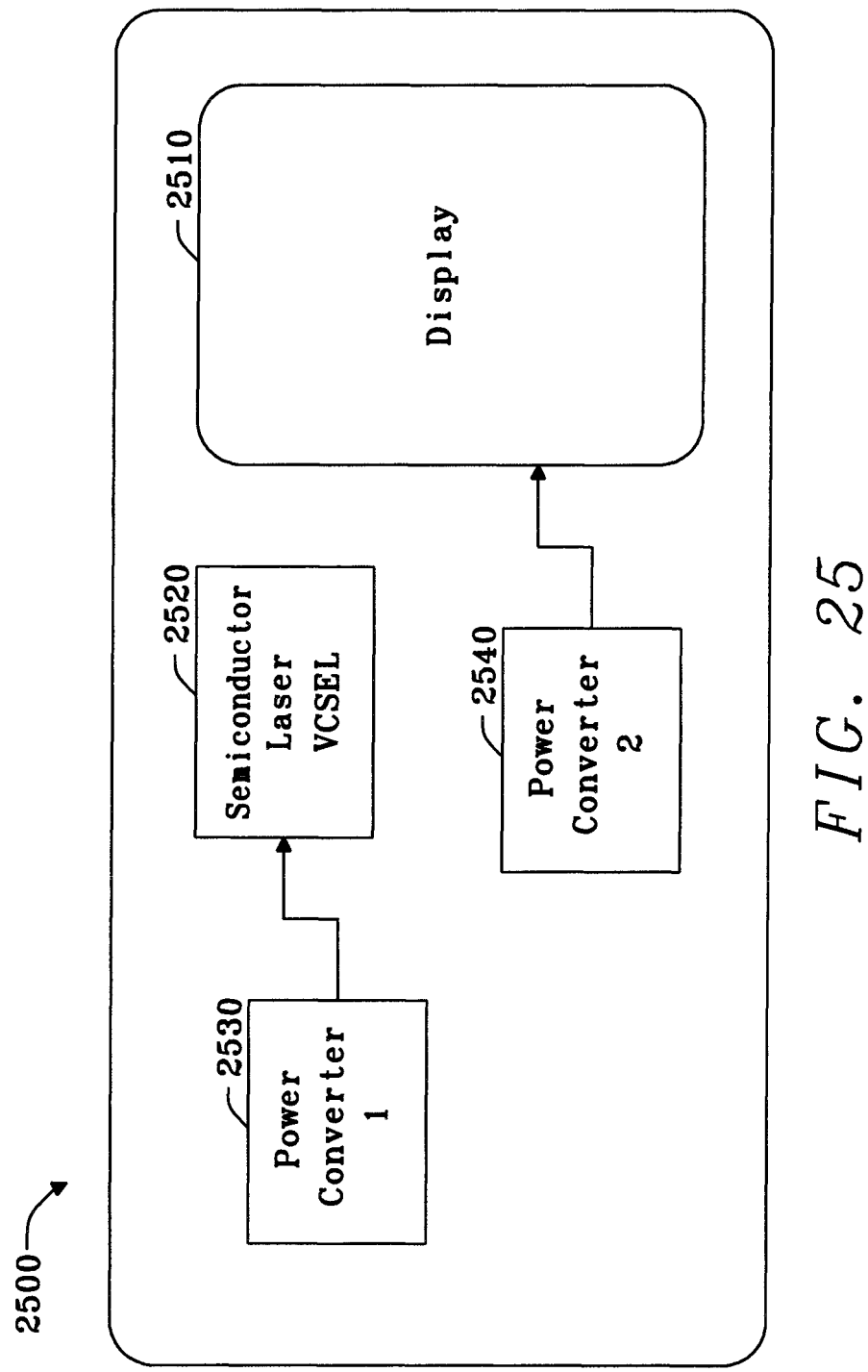
FIG. 25 is a diagram of a user device provided with a display and a power converter according to the disclosure.

FIG. 25 is a diagram of a user device 2500 provided with a display 2510 such as an OLED display, and semiconductor laser diode 2520 such as a VCSEL. A first power converter 2530 is provided to power the semiconductor laser 2520 and a second power converter 2540 is provided to power the display 2510.

The first power converter 2530 may be implemented as the buck-boost converter of FIG. 3. The high peak currents of laser diodes typically require multi-phase solutions of traditional pure inductive power converters. For typical battery voltage levels, the buck converter of FIG. 3 reduces inductor current and from that may enable a single phase solution. It reduces inductor conduction loss and inductor current ripple and with that improves conversion efficiency compared with the prior art converter of FIG. 1A. It furthermore reduces the voltage rating of power FETs and removes the need for back-to-back switches, hence reducing die area and power loss of the converter.

The second power converter 2540 may be implemented as the buck-boost converter of FIG. 14. The buck-boost converter of FIG. 14 addresses the need for larger maximum voltage step-up ratios while maintaining key benefits of the hybrid converter architecture. Reduced average inductor current and inductor current ripple enables the selection of coils with lower inductance and lower saturation current or even the removal of a complete converter phase. This reduces bill of materials (BOM), size, costs and improves converter efficiency. A lower inductance also enables a faster converter response to transient line and load conditions, hence reducing converter output voltage ripple.

The operation of the power converters described with reference to FIGS. 3 and 14 may be further improved by selecting specific driving sequences.

Referring back to the power converter of FIG. 3, and the states D1, B1, D2, DV, B2, DP described in FIGS. 4 to 9, it will be appreciated that other combination of switching sequences may be considered.

For voltage conversion ratios in the range of $\frac{1}{2}<V_{OUT}/V_{IN}<1$ one or multiple switching states $DP_n$ according to FIG. 9 may be inserted in the sequence. An example switching sequence may be D1-DP-D2-DP and repeated for each driving period T.

For voltage conversion ratios in the range of $1<V_{OUT}/V_{IN}$ the switching state $DP_n$ may be replaced with the switching state B1 according to FIG. 5 and the switching state D1 and D2 may be replaced with the switching state B2 according to FIG. 8.

For switching sequences with 2×DV, 2×DP or 2×B1 with 2×B2 states the equations (1), (2) and (3) may be replaced by equations (1)', (2)' and (3)' below. The example relationship between input and output voltage is obtained by applying the volt-sec balance principle to the voltage of the inductor:

$$\frac{V_{OUT}}{V_{IN}} = \frac{3D}{1+2D} \quad D1 = D, D2 = 3D, 2DV = 1 - 4D \quad D \in [0, 0.25] \quad (1)'$$

$$\frac{V_{OUT}}{V_{IN}} = \frac{1+2D}{4-4D} \quad D1 = \frac{1}{2} - D, \quad (2)'$$

$$D2 = \frac{3}{2} - 3D, 2DP = 4D - 1 \quad D \in [0.25, 0,5]$$

$$\frac{V_{OUT}}{V_{IN}} = \frac{6D+1}{4} \quad 2B1 = \frac{7}{4} - \frac{3D}{2}, 2B2 = \frac{3D}{2} - \frac{3}{4} \quad D \in [0.5, 1] \quad (3)'$$

The parameter D restricts the minimum and maximum voltage conversion ratio within a specific operation mode. The sequences are presented so that for (1)' 2DV+D1+D2=1, for (2)' 2DP+D1+D2=1 and for (3)' 2B2+2B1=1.

For charge-balance of the flying capacitor $C_F$ the switch S5 must be closed during switching state D1 or DV (or both). If closed during both states, the average current through the inductor is reduced in comparison to the average output current according to:

$$\frac{I_L}{I_{OUT}} = \frac{1}{2+D} \quad D1 = D, D2 = 3D, 2DV = 1 - 4D \quad D \in [0, 0.25] \quad (4)'$$

$$\frac{I_L}{I_{OUT}} = \frac{1}{2-2D} \quad D1 = \frac{1}{2} - D, D2 = \frac{3}{2} - 3D, \quad (5)'$$

$$2DP = 4D - 1 \quad D \in [0.25, 0,5]$$

$$\frac{I_L}{I_{OUT}} = 1 \quad 2B1 = \frac{7}{4} - \frac{3D}{2}, 2B2 = \frac{3D}{2} - \frac{3}{4} \quad D \in [0.5, 1] \quad (6)'$$

The inductor peak-to-peak current ripple $\Delta I_L$ is according to:

$$\Delta I_L = \frac{V_{IN}}{2Lf_{SW}} \frac{3D}{1+2D}(1 - 4D); D1 = D, \quad (7)'$$

$$D2 = 3D, 2DV = 1 - 4D; D \in [0,0.25]$$

$$\Delta I_L = \frac{V_{IN}}{2Lf_{SW}} \frac{3 - 6D}{4-4D}(1 - 4D); D1 = \frac{1}{2} - D, \quad (8)'$$

$$D2 = \frac{3}{2} - 3D, 2DP = 4D - 1 \quad D \in [0.25,0.5]$$

$$\Delta I_L = \frac{V_{IN}}{2Lf_{SW}} \left(\frac{7}{4} - \frac{3D}{2}\right)\left(\frac{3D}{2} - \frac{3}{4}\right) \quad 2B1 = \frac{7}{4} - \frac{3D}{2}, \quad (9)'$$

$$2B2 = \frac{3D}{2} - \frac{3}{4} \quad D \in [0.5,1]$$

Figure 26:
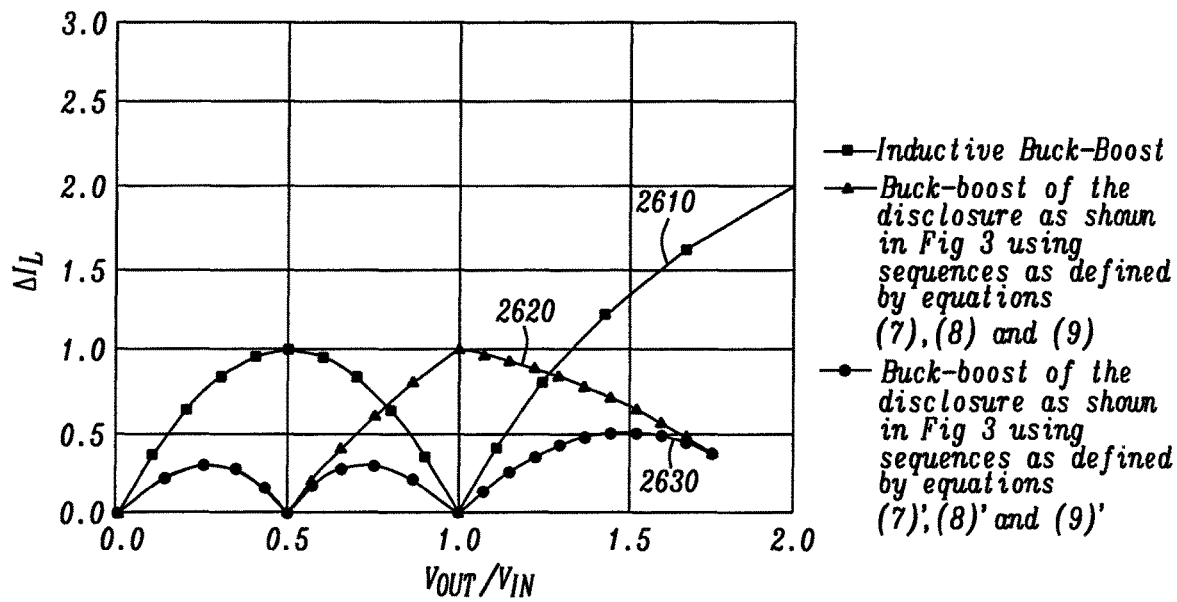
FIG. 26 is another plot of the inductor peak-to-peak current ripple as a function of the voltage conversion ratio $V_{OUT}/V_{IN}$ obtained for a conventional inductive buck-boost topology, the buck-boost of FIG. 3 using sequences as defined by equations (7), (8) and (9), and the buck-boost of FIG. 3 using the sequences as defined by equations (7)', (8)' and (9)'.

FIG. 26 shows another plot of the inductor peak-to-peak current ripple as a function of the voltage conversion ratio $V_{OUT}/V_{IN}$ obtained for a conventional inductive buck-boost topology, the buck-boost of FIG. 3 using sequences as defined by equations (7), (8) and (9), and the buck-boost of FIG. 3 using the sequences as defined by equations (7)', (8)' and (9)'. For each topology the inductor current ripple is shown for an input voltage of $V_{IN}$=4 V, an inductor L=1 µH and a converter switching frequency $f_{SW}$=1 MHz.

Compared with the switching sequences defined by equations (7), (8) and (9), the switching sequences defined by equations (7)', (8)', and (9)' reduce inductor current ripple, the corresponding output voltage ripple and inductor core loss significantly.

Referring back to the power converter of FIG. 14, and the states D1', B1', D2', DP', B2', DV' described in FIGS. 15 to 20, it will be appreciated that other combination of switching sequences may be considered.

During step-down conversion the switching sequence may contain the states B1' and B2' according to FIGS. 16 and 19. The switching state B1' results to a voltage conversion ratio of $V_{OUT}/V_{IN}$=1.

For voltage conversion ratios in the range of $V_{OUT}/V_{IN}$<1 one or multiple switching states B2', according to FIG. 19, may be inserted into the switching sequence. The switching sequence then automatically controls the voltage $V_{CF}$ across the flying capacitor $C_F$ to $V_{CF}=V_{OUT}$. An example switching sequence may be B1'-B2'-B1'-B2' and repeated for each driving period T.

For voltage conversion ratios in the range of 1<$V_{OUT}/V_{IN}$<2 the switching state DV' according to FIG. 20 may replace the state B1' and states D1' and D2' may be inserted into the switching sequence. The switching sequence then automatically controls the voltage $V_{CF}$ across the flying capacitor $C_F$ to $V_{CF}=V_{IN}$. An example switching sequence may be D1'-DV'-D2'-DV' and repeated for each driving period T.

For voltage conversion ratios in the range of 2<$V_{OUT}/V_{IN}$ the switching states DV' may be partially or fully replaced with the switching state DP' according to FIG. 18.

For switching sequences with 2×DP', 2×DV' or 2×B1' with 2×B2' states the equations (10), (11), and (12) may be replaced by equations (10)', (11)', and (12)' below. The example relationship between input and output voltage is obtained by applying the volt-sec balance principle to the voltage of the inductor:

$$\frac{V_{OUT}}{V_{IN}} = \frac{4}{7-12D} \quad 2B1' = \frac{1}{4} + 3D, 2B2' = \frac{3}{4} - 3D \quad D \in [0, 0.25] \quad (10)'$$

$$\frac{V_{OUT}}{V_{IN}} = \frac{8D+2}{5-4D} \quad D1' = D - \frac{1}{4}, \quad (11)'$$

$$D2' = 3D - \frac{3}{4}, 2DV' = 2 - 4D \quad D \in [0.25, 0,5]$$

$$\frac{V_{OUT}}{V_{IN}} = \frac{4-2D}{3-3D} \quad D1' = \frac{1}{2} - \frac{D}{2}, \quad (12)'$$

$$D2' = \frac{3}{2} - \frac{3D}{2}, 2DP' = 2D - 1 \quad D \in [0.5, 1]$$

The parameter D restricts the minimum and maximum voltage conversion ratio within a specific operation mode. The sequences are presented so that for (10)' 2B1'+2B2'=1, for (11)' D1'+D2'+2DV'=1 and for (12)' D1'+D2'+2DP'=1.

For charge-balance of the flying capacitor $C_F$ the switch S5 must be closed during switching state D1' or DP' (or both). If closed during both states, the average current through the inductor is reduced in comparison to the average output current according to:

$$\frac{I_L}{I_{OUT}} = \frac{4}{7-12D} \quad 2B1' = \frac{1}{4} + 3D, 2B2' = \frac{3}{4} - 3D \quad D \in [0, 0.25] \quad (13)'$$

$$\frac{I_L}{I_{OUT}} = \frac{4}{5-4D} \quad D1' = D - \frac{1}{4}, D2' = 3D - \frac{3}{4}, \quad (14)'$$

$$2DV' = 2 - 4D \quad D \in [0.25, 0,5]$$

$$\frac{I_L}{I_{OUT}} = \frac{2}{3-3D} \quad D1' = \frac{1}{2} - \frac{D}{2}, \quad (15)'$$

-continued $$D2' = \frac{3}{2} - \frac{3D}{2}, 2DP' = 2D - 1 \ D \in [0.5, 1]$$

The inductor peak-to-peak current ripple $\Delta I_L$ is according to:

$$\Delta I_L = \frac{V_{IN}}{2Lf_{SW}}\left(\frac{1+12D}{7-12D}\right)\left(\frac{3}{4}-3D\right) 2B1' = \frac{1}{4} + 3D, \quad (16)'$$

$$2B2' = \frac{3}{4} - 3D \ D \in [0, 0.25]$$

$$\Delta I_L = \frac{V_{IN}}{2Lf_{SW}}\left(\frac{3-12D}{5-4D}\right)(2-4D) \ D1' = D - \frac{1}{4}, \quad (17)'$$

$$D2' = 3D - \frac{3}{4}, 2DV' = 2 - 4D \ D \in [0.25, 0.5]$$

$$\Delta I_L = \frac{V_{IN}}{2Lf_{SW}}(2D-1) \ D1' = \frac{1}{2} - \frac{D}{2}, \quad (18)'$$

$$D2' = \frac{3}{2} - \frac{3D}{2}, 2DP' = 2D - 1 \ D \in [0.5, 1]$$

Figure 27:
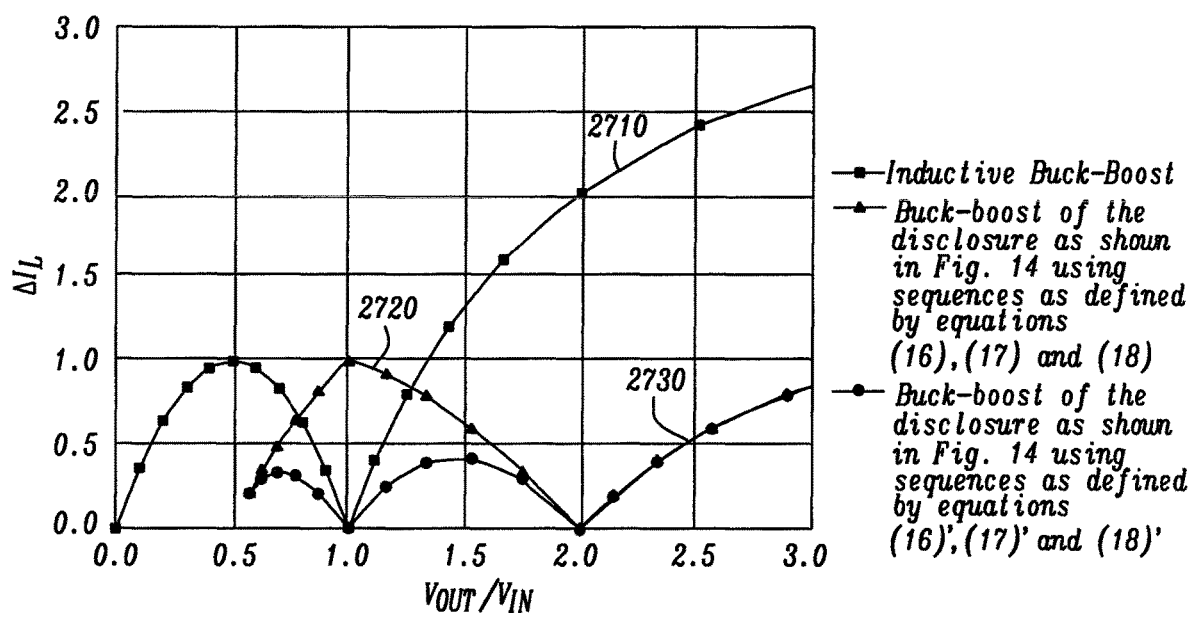
FIG. 27 is a plot of the inductor peak-to-peak current ripple as a function of the voltage conversion ratio $V_{OUT}/V_{IN}$ obtained for a conventional inductive buck-boost topology, the buck-boost of FIG. 14 using sequences as defined by equations (16), (17) and (18), and the buck-boost of FIG. 14 using the sequences as defined by equations (16)', (17)' and (18)'.

FIG. 27 shows a plot of the inductor peak-to-peak current ripple as a function of the voltage conversion ratio $V_{OUT}/V_{IN}$ for a conventional inductive buck-boost topology, the buck-boost of FIG. 14 using sequences as defined by equations (16), (17) and (18), and the buck-boost of FIG. 14 using the sequences as defined by equations (16)', (17)' and (18)'. For each topology the inductor current ripple is shown for an input voltage of $V_{IN}$=4 V, an inductor L=1 µH and a converter switching frequency $f_{SW}$=1 MHz.

Compared with the switching sequences defined by equations (16), (17), and (18), the switching sequences defined by equations (16)', (17)', and (18)' reduce inductor current ripple, the corresponding output voltage ripple and inductor core loss significantly.

In summary the buck-boost converter of the disclosure provides high conversion efficiency, small solution footprint and low output voltage ripple across the whole range of supported voltage conversion ratios.

A skilled person will appreciate that variations of the disclosed arrangements are possible without departing from the disclosure. For instance although the buck-boost of the disclosure has been described as a single phase converter it will be appreciated that the topology could be extended to obtain a multiphase buck-boost converter. Accordingly, the above description of the specific embodiments is made by way of example only and not for the purposes of limitation. It will be clear to the skilled person that minor modifications may be made without significant changes to the operation described.

What is claimed is:

1. A power converter for providing an output voltage with a target conversion ratio, the power converter being operable in a first mode as a step-down converter or in a second mode as a step-up converter, the power converter comprising a ground port, a first port and a second port;
   an inductor having a first terminal connected to the second port;
   a flying capacitor coupled to a network of switches comprising
   a first switch to couple a first terminal of the flying capacitor to the first port;
   a second switch to couple a second terminal of the flying capacitor to the first port;
   a third switch to couple the first terminal of the flying capacitor to the second terminal of the inductor;
   a fourth switch to couple the second terminal of the flying capacitor to the second terminal of the inductor;
   a fifth switch to couple the second terminal of the flying capacitor to the ground port;
   a sixth switch to couple the first terminal of the flying capacitor to the second port; and
   a driver adapted to drive the network of switches with a sequence of states during a drive period, wherein depending on the mode of operation the sequence of states comprises at least one of a first state and a second state;
   wherein in the first state the ground port is coupled to the second port via a first path and a second path, the first path comprising the flying capacitor and the inductor, and the second path comprising the flying capacitor while bypassing the inductor;
   wherein in the second state the first port is coupled to the second port via a third path that includes the inductor and wherein the ground port is coupled to the first port via a fourth path that includes the flying capacitor while bypassing the inductor.

2. The power converter as claimed in claim 1, wherein in the first state the voltage across the inductor is null.

3. The power converter as claimed in claim 1, wherein for a conversion ratio of output voltage over input voltage less than one the voltage across the flying capacitor is driven substantially equal to the output voltage, and wherein for a conversion ratio of output voltage over input voltage greater than one the voltage across the flying capacitor is driven substantially equal to the input voltage.

4. The power converter as claimed in claim 1, wherein when the power converter operates with a conversion ratio of output voltage over input voltage equal to one, the sequence of states comprises both the first state and the second state.

5. The power converter as claimed in claim 1, wherein the first port is an input port for receiving an input voltage and the second port is an output port for providing an output voltage.

6. The power converter as claimed in claim 5, wherein the conversion ratio of output voltage over input voltage is less than two.

7. The power converter as claimed in claim 5, wherein the inductor has an average inductor current and an inductor current ripple, and wherein both reach a minimum value for a conversion ratio of the output voltage over the input voltage of one half.

8. The power converter as claimed in claim 5, wherein when the power converter operates as a step-up converter, the sequence of states comprises the second state, and when the power converter operates as a step-down converter, the sequence of states comprises the first state.

9. The power converter as claimed in claim 8, wherein in the second state the first port is coupled to the second port via the third path that includes the first switch, the third switch and the inductor, and wherein the ground port is coupled to the second port via the fifth switch, the flying capacitor, the third switch and the inductor.

10. The power converter as claimed in claim 1, wherein the second port is an input port for receiving an input voltage and the first port is an output port for providing an output voltage.

11. The power converter as claimed in claim 10, wherein the conversion ratio of output voltage over input voltage is greater than one half.

12. The power converter as claimed in claim 10, wherein the inductor has an inductor current ripple, and wherein the inductor current ripple reaches a minimum value for a conversion ratio of the output voltage over the input voltage of one, and/or for a conversion ratio of the output voltage over the input voltage of two.

13. The power converter as claimed in claim 10, wherein when the power converter operates as a step-down converter, the sequence of states comprises the second state and when the power converter operates as a step-up converter the sequence of states comprises the first state.

14. The power converter as claimed in claim 13, wherein in the second state the first port is coupled to the second port via the third path that includes the first switch, the third switch and the inductor, and wherein the ground port is coupled to the first port via the fourth path that includes the fifth switch, the flying capacitor, the first switch.

15. A method of converting power with a target conversion ratio, the method comprising
providing a power converter operable in a first mode as a step-down converter or in a second mode as a step-up converter, the power converter comprising a ground port, a first port and a second port,
an inductor having a first terminal connected to the second port;
a flying capacitor coupled to a network of switches comprising
a first switch to couple a first terminal of the flying capacitor to the first port;
a second switch to couple a second terminal of the flying capacitor to the first port;
a third switch to couple the first terminal of the flying capacitor to the second terminal of the inductor;
a fourth switch to couple the second terminal of the flying capacitor to the second terminal of the inductor;
a fifth switch to couple the second terminal of the flying capacitor to the ground port;
a sixth switch to couple the first terminal of the flying capacitor to the second port; and
driving the network of switches with a sequence of states during a drive period, wherein depending on the mode of operation the sequence of states comprises at least one of a first state and a second state,
wherein in the first state the ground port is coupled to the second port via a first path and a second path, the first path comprising the flying capacitor and the inductor, and the second path comprising the flying capacitor while bypassing the inductor;
wherein in the second state the first port is coupled to the second port via a third path that includes the inductor, and wherein the ground port is coupled to the first port via a fourth path that includes the flying capacitor while bypassing the inductor.

16. A user device comprising a display and a first power converter as claimed in claim 1 for powering the display.

17. The power converter as claimed in claim 1, wherein the sequence of states further comprises a third state.

18. The power converter as claimed in claim 17, wherein in the third state the first port is coupled to the second port via a fifth path that includes the first switch, the flying capacitor, the fourth switch and the inductor.

19. The power converter as claimed in claim 18, wherein the sequence of states further comprises a fourth state.

20. The power converter as claimed in claim 19, wherein in the fourth state the ground port is coupled to the second port via a sixth path and the second path, the sixth path comprising the inductor and the second path comprising the flying capacitor while bypassing the inductor.

21. The power converter as claimed in claim 20, wherein the first port is an input port for receiving an input voltage and the second port is an output port for providing an output voltage, wherein the fourth state is a de-magnetization state and wherein the conversion ratio of the output voltage over the input voltage is less than one half.

22. The power converter as claimed in claim 20, wherein the second port is an input port for receiving an input voltage and the first port is an output port for providing an output voltage, wherein the fourth state is a magnetization state, and wherein the conversion ratio of the output voltage over the input voltage is greater than two.

23. The power converter as claimed in claim 19, wherein in the fourth state the first port is coupled to the second port via an eighth path that includes the second switch, the flying capacitor, the third switch and the inductor.

24. The power converter as claimed in claim 23, wherein the first port is an input port for receiving an input voltage and the second port is an output port for providing an output voltage, and wherein the power converter operates as a step-down converter.

25. The power converter as claimed in claim 23, wherein the second port is an input port for receiving an input voltage and the first port is an output port for providing an output voltage, and wherein the conversion ratio of the output voltage over the input voltage is between one and two.

26. The power converter as claimed in claim 25, wherein a voltage across the flying capacitor remains between the input voltage and the output voltage during the drive period.

27. The user device as claimed in claim 16 further comprising a semiconductor laser and a second power converter as claimed in claim 1 for powering the semiconductor laser.

* * * * *